United States Patent
Noudo et al.

(10) Patent No.: US 11,990,489 B2
(45) Date of Patent: May 21, 2024

(54) IMAGING DEVICE AND METHOD OF MANUFACTURING IMAGING DEVICE

(71) Applicant: SONY SEMICONDUCTOR SOLUTIONS CORPORATION, Kanagawa (JP)

(72) Inventors: Shinichiro Noudo, Kumamoto (JP); Takuji Matsumoto, Kumamoto (JP); Yuji Iseri, Kanagawa (JP); Taizo Oishi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 770 days.

(21) Appl. No.: 17/047,636

(22) PCT Filed: Feb. 19, 2019

(86) PCT No.: PCT/JP2019/005987
§ 371 (c)(1),
(2) Date: Oct. 14, 2020

(87) PCT Pub. No.: WO2019/215986
PCT Pub. Date: Nov. 14, 2019

(65) Prior Publication Data
US 2021/0118930 A1    Apr. 22, 2021

(30) Foreign Application Priority Data

May 8, 2018  (JP) ................................ 2018-089937

(51) Int. Cl.
*H01L 27/146*   (2006.01)
*H04N 25/60*    (2023.01)
*H04N 25/702*   (2023.01)

(52) U.S. Cl.
CPC .. *H01L 27/14623* (2013.01); *H01L 27/14605* (2013.01); *H01L 27/14692* (2013.01); *H04N 25/60* (2023.01); *H04N 25/702* (2023.01)

(58) Field of Classification Search
CPC ......... H01L 27/14623; H01L 27/14605; H01L 27/14627; H01L 27/14685
See application file for complete search history.

(56) References Cited

U.S. PATENT DOCUMENTS

| 2003/0122209 A1 | 7/2003 | Uya |
| 2004/0132262 A1 | 7/2004 | Ayabe et al. |

(Continued)

FOREIGN PATENT DOCUMENTS

| CN | 1497953 A | 5/2004 |
| CN | 1591882 A | 3/2005 |

(Continued)

OTHER PUBLICATIONS

International Search Report and Written Opinion of PCT Application No. PCT/JP2019/005987, dated May 14, 2019, 12 pages of ISRWO.

*Primary Examiner* — Matthew L Reames
(74) *Attorney, Agent, or Firm* — CHIP LAW GROUP

(57) ABSTRACT

A plurality of photoelectric converters is formed on a semiconductor substrate and performs photoelectric conversion according to incident light. A light path portion includes a transparent film through which the incident light is transmitted, a light-blocking wall for each of the plurality of photoelectric converters, the light-blocking wall partitioning the transparent film in a direction perpendicular to the semiconductor substrate, and blocking light, and a light-blocking film at an end of the light-blocking wall, the end being opposite to an end of the light-blocking wall that is closer to the semiconductor substrate, the light-blocking film having a film shape parallel to the semiconductor substrate, (Continued)

and including, for each of the plurality of photoelectric converters, an opening through which the incident light is transmitted. An on-chip lens is arranged for each of the plurality of photoelectric converters, and collects the incident light into the photoelectric converter through the light path portion.

18 Claims, 21 Drawing Sheets

(56) References Cited

U.S. PATENT DOCUMENTS

| | | |
|---|---|---|
| 2005/0045928 A1 | 3/2005 | Kuriyama |
| 2006/0060896 A1 | 3/2006 | Kuriyama |
| 2008/0251874 A1 | 10/2008 | Ishibe |
| 2017/0338265 A1 | 11/2017 | Yoshiba et al. |

FOREIGN PATENT DOCUMENTS

| | | |
|---|---|---|
| CN | 101271914 A | 9/2008 |
| CN | 106068563 A | 11/2016 |
| DE | 60223330 T2 | 2/2008 |
| EP | 1326285 A2 | 7/2003 |
| EP | 1396888 A2 | 3/2004 |
| JP | 2003-197897 A | 7/2003 |
| JP | 2003-282850 A | 10/2003 |
| JP | 2004-104203 A | 4/2004 |
| JP | 2005-079338 A | 3/2005 |
| JP | 2008-235689 A | 10/2008 |
| KR | 10-2004-0022169 A | 3/2004 |
| KR | 10-2008-0086414 A | 9/2008 |
| KR | 10-2017-0103624 A | 9/2017 |
| TW | 200412669 A | 7/2004 |
| WO | 2016/114154 A1 | 7/2016 |

IMAGING DEVICE AND METHOD OF MANUFACTURING IMAGING DEVICE

CROSS REFERENCE TO RELATED APPLICATIONS

This application is a U.S. National Phase of International Patent Application No. PCT/JP2019/005987 filed on Feb. 19, 2019, which claims priority benefit of Japanese Patent Application No. JP 2018-089937 filed in the Japan Patent Office on May 8, 2018. Each of the above-referenced applications is hereby incorporated herein by reference in its entirety.

TECHNICAL FIELD

The present disclosure relates to an imaging device and a method of manufacturing the imaging device. In particular, the present disclosure relates to an imaging device that blocks light that does not contribute toward imaging, and a method of manufacturing the imaging device.

BACKGROUND ART

Conventionally, an imaging device used in a camera or the like includes pixels arranged in a two-dimensional grid, each pixel being formed by stacking a photoelectric converter that performs photoelectric conversion according to incident light, a color filter, and an on-chip lens. An imaging lens that forms an image of a subject is arranged in the camera, the focal position is detected using autofocusing or the like, and an image of a subject is formed on a light receiving surface of the imaging device that is a surface on which the pixels are arranged. Here, light from the subject substantially perpendicularly enters a pixel situated in a central portion of the light receiving surface, whereas the light from the subject obliquely enters a pixel surrounding the central portion. The reason is that a principal ray of a camera lens for image-capturing differs depending on the image height, the camera lens being used in combination with the imaging device. In order to improve the sensitivity to the obliquely incident light, pupil correction in which the on-chip lens and the color filter are arranged in a state of being shifted in a direction of the central portion of the light receiving surface, is performed.

An amount of pupil correction that is an amount of shift of an on-chip lens and a color filter is increased according to the distance from the central portion of the light receiving surface. A pixel arranged in a surrounding portion of the light receiving surface is in an arrangement in which an on-chip lens and a color filter of the pixel go far beyond a region of the pixel into a region of an adjacent pixel. Thus, light transmitted through a color filter of a different pixel enters a photoelectric converter of the adjacent pixel, and this results in crosstalk that causes an error in an image signal. With respect to the imaging device, an optical design regarding a light-collecting structure, such as a shape of the on-chip lens, the presence or absence of an intralayer lens, and a distance from the on-chip lens to the light receiving surface, is performed according to the product specifications. When a light-collecting structure is adopted that is long in height and includes an on-chip lens arranged at a high position, there is an increase in crosstalk of a pixel arranged in the surrounding portion of the light receiving surface, and there is a reduction in image quality. An imaging device in which multi-stage light-blocking walls are arranged is used as a device that suppresses a reduction in image quality due to the crosstalk (for example, see Patent Literature 1). Note that the light-blocking wall is a wall that is made of metal or the like and blocks incident light.

CITATION LIST

Patent Literature

Patent Literature 1: WO2016/114154

DISCLOSURE OF INVENTION

Technical Problem

The related art described above adopts a light-collecting structure long in height for a back-surface-type imaging device in which incident light is irradiated onto a back surface of a semiconductor substrate on which a photoelectric converter is formed. Multi-stage light-blocking walls are arranged in a state of being shifted according to the amount of pupil correction, and this results in preventing crosstalk. However, there is a problem in which light other than normal light with which an imaging lens of a camera forms an image of a subject, such as light (hereinafter referred to as stray light) that is reflected off, for example, a wall surface of a housing that accommodates the imaging device to enter the imaging device, is not sufficiently blocked, and this results in crosstalk.

The present disclosure has been achieved to solve the problems described above, and a first aspect of the present disclosure is an imaging device that includes a plurality of photoelectric converters each formed on a semiconductor substrate and each performing photoelectric conversion according to incident light; a light path portion that includes a transparent film through which the incident light is transmitted, a light-blocking wall for each of the plurality of photoelectric converters, the light-blocking wall partitioning the transparent film in a direction perpendicular to the semiconductor substrate, and blocking light, and a light-blocking film that is arranged near an end of the light-blocking wall, the end being situated opposite to an end of the light-blocking wall that is situated closer to the semiconductor substrate, the light-blocking film having a film shape parallel to the semiconductor substrate, and including, for each of the plurality of photoelectric converters, an opening through which the incident light is transmitted; and an on-chip lens that is arranged for each of the plurality of photoelectric converters, and collects the incident light into the photoelectric converter through the light path portion. This provides an effect of causing incident light to enter the light path portion through the opening of the light-blocking film.

Further, in the first aspect, the light path portion may include a plurality of the light-blocking walls.

Further, in the first aspect, the light-blocking film may be arranged near at least one of the plurality of the light-blocking walls.

Further, in the first aspect, when the light-blocking film is arranged between two of the plurality of the light-blocking walls, at least one of the two of the plurality of the light-blocking walls may be arranged at a position different from an end of the light-blocking film.

Further, in the first aspect, the light-blocking walls of the plurality of the light-blocking walls may each be formed to have a different width.

Further, in the first aspect, the light-blocking film may be arranged adjacent to the light-blocking wall.

Further, in the first aspect, the light-blocking film may be made of the same material as the light-blocking wall.

Further, in the first aspect, the light-blocking film may be formed at the same time as the light-blocking wall.

Further, in the first aspect, in the light path portion, the light-blocking wall and the opening of the light-blocking film may be arranged in a state of being shifted according to an incident angle of the incident light.

Further, in the first aspect, a light-collecting section that is arranged near the light-blocking film and has a refractive index different from a refractive index of the transparent film may be further included.

Further, in the first aspect, the light-collecting section may be arranged at a position different from a position near the opening of the light-blocking film.

Further, in the first aspect, an antireflective film that is arranged adjacent to the light-blocking film and prevents reflection of the incident light may be further included.

Further, in the first aspect, the light-blocking film may include the opening having a shape other than a rectangle.

Further, in the first aspect, an intralayer lens that is arranged in the light path portion and collects the incident light may be further included.

Further, in the first aspect, a plurality of pixels each including the photoelectric converter, the on-chip lens, and the light path portion may be further included, and each of the plurality of pixels may further include a light-blocking layer that is arranged between the semiconductor substrate and the light path portion for each of the plurality of pixels, and includes an opening through which the incident light is transmitted.

Further, in the first aspect, a phase difference pixel may be further included, the phase difference pixel being the pixel performing pupil division with respect to the incident light from a subject by arranging the opening of the light-blocking layer in a state of being shifted in a specified pupil-division direction, and detecting a phase difference.

A second aspect of the present disclosure is a method of manufacturing an imaging device, the method including forming a transparent film on a semiconductor substrate on which a photoelectric converter performing photoelectric conversion according to incident light is formed, the transparent film being a transparent film through which the incident light is transmitted; forming, for each photoelectric conversion, a light-blocking wall that partitions the formed transparent film in a direction perpendicular to the semiconductor substrate, and blocks light; forming a light-blocking film that is arranged near an end of the formed light-blocking wall, the end being situated opposite to an end of the light-blocking wall that is situated closer to the semiconductor substrate, the light-blocking film having a film shape parallel to the semiconductor substrate, and including, for each photoelectric converter, an opening through which the incident light is transmitted; and forming an on-chip lens that collects the incident light into the photoelectric converter. This provides an effect of causing incident light to enter the light path portion through the opening of the light-blocking film.

The light-blocking film described above corresponds to a diaphragm arranged at an entrance of the light path portion, and entrance of stray light is expected to be limited.

ADVANTAGEOUS EFFECTS OF INVENTION

The present disclosure provides an excellent effect of reducing the occurrence of crosstalk due to stray light.

Figure 4A:
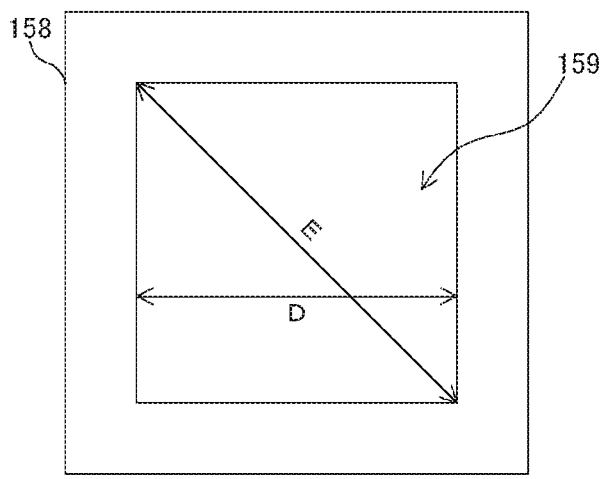
Figure 4B:
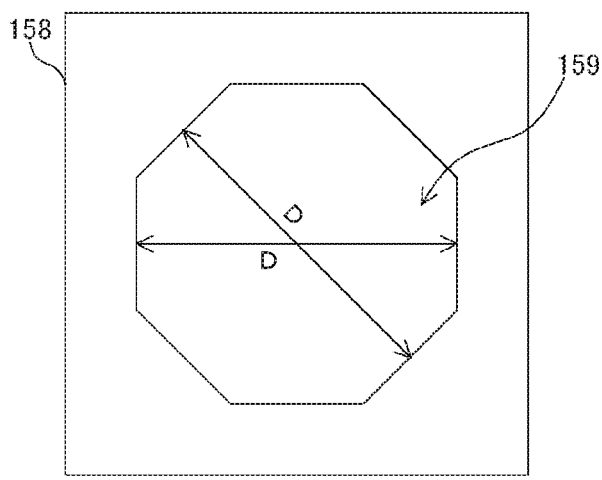
Figure 4C:
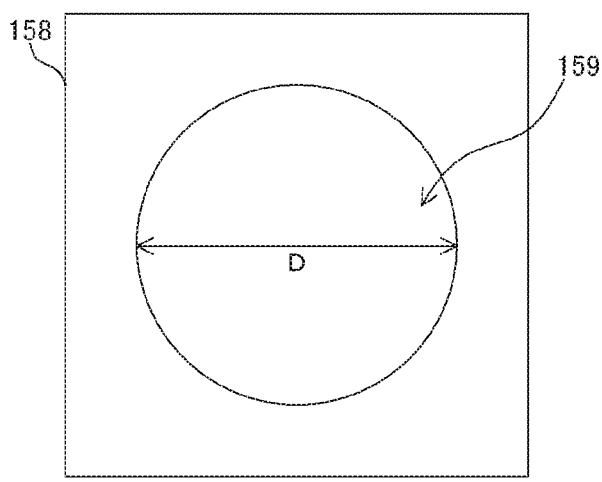

FIGS. 4A, 4B, and 4C illustrate a configuration example of a light-blocking film according to the first embodiment of the present disclosure.

FIGS. 5A, 5B, 5C, and 5D illustrate an example of a method of manufacturing the imaging device according to the first embodiment of the present disclosure.

Figure 6A:
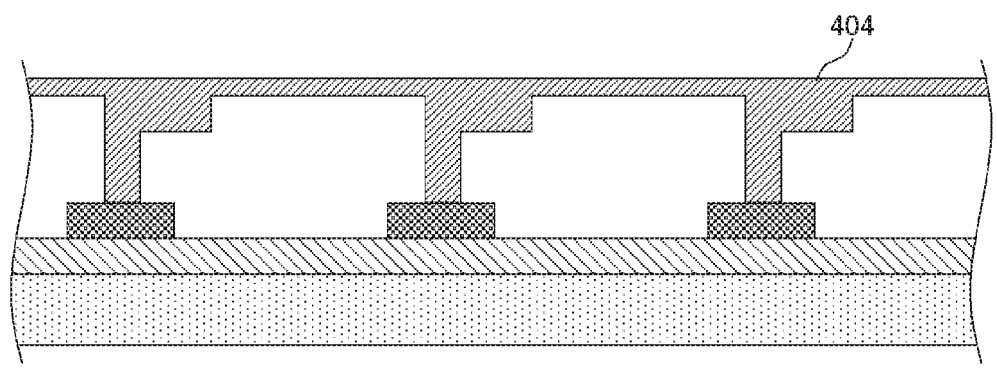
Figure 6B:
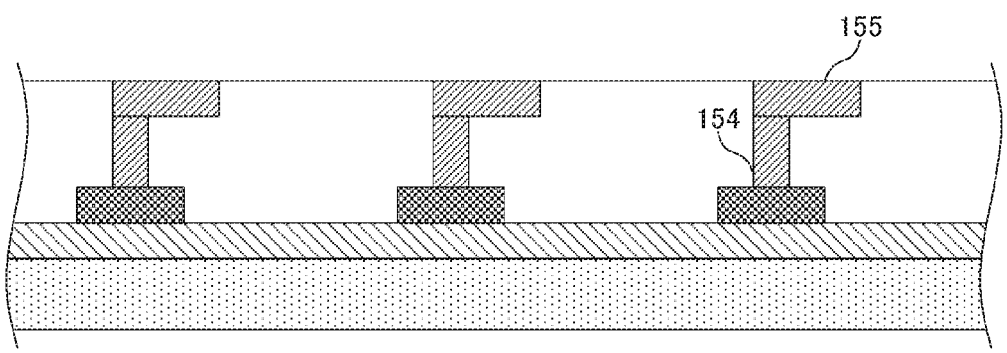
Figure 6C:
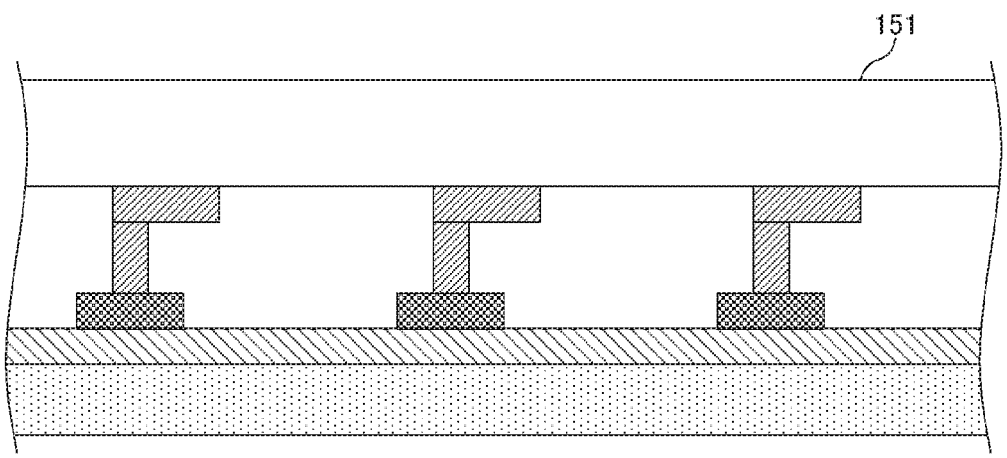

FIGS. 6A, 6B, and 6C illustrate the example of the method of manufacturing the imaging device according to the first embodiment of the present disclosure.

Figure 7A:
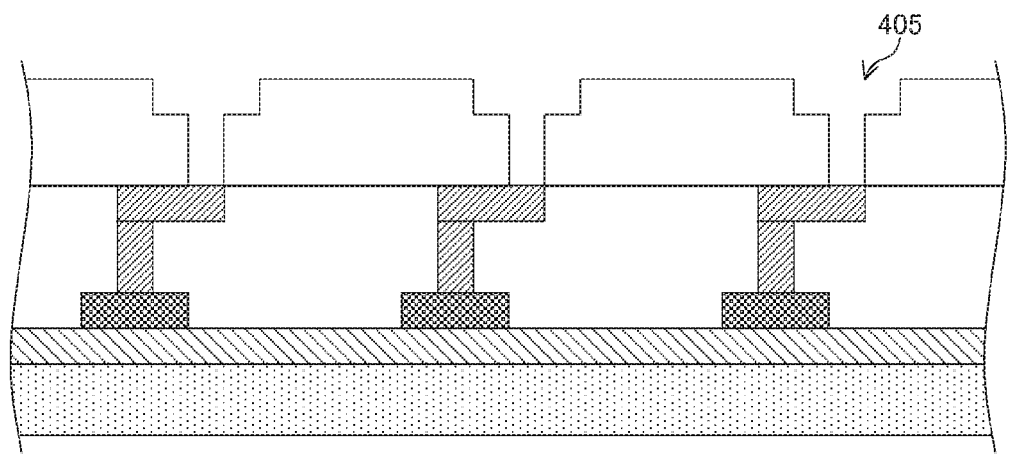
Figure 7B:
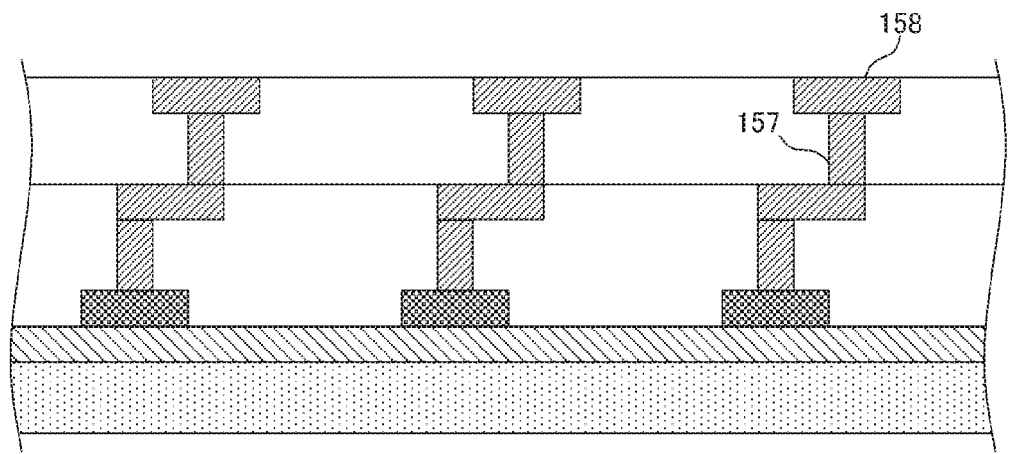
Figure 7C:
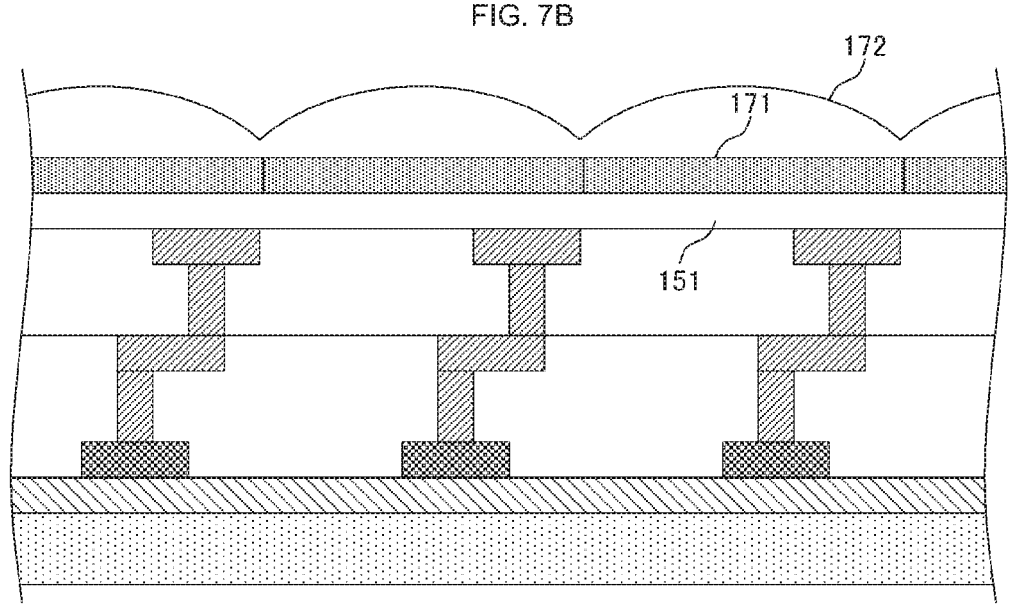

FIGS. 7A, 7B, and 7C illustrate the example of the method of manufacturing the imaging device according to the first embodiment of the present disclosure.

FIGS. 8A, 8B, 8C, and 8D illustrate another example of the method of manufacturing the imaging device according to the first embodiment of the present disclosure.

Figure 9:
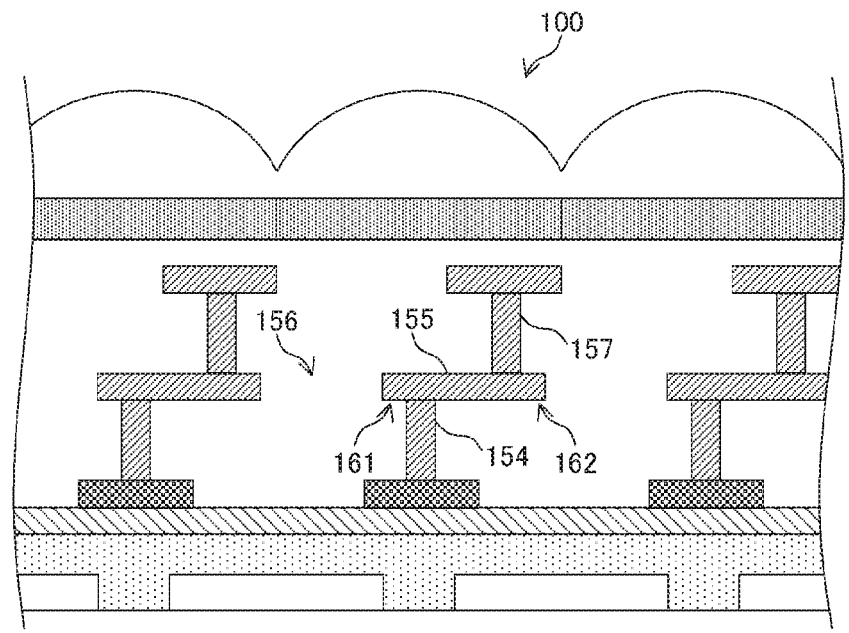

FIG. 9 illustrates a configuration example of the pixel according to a first modification of the first embodiment of the present disclosure.

Figure 10:
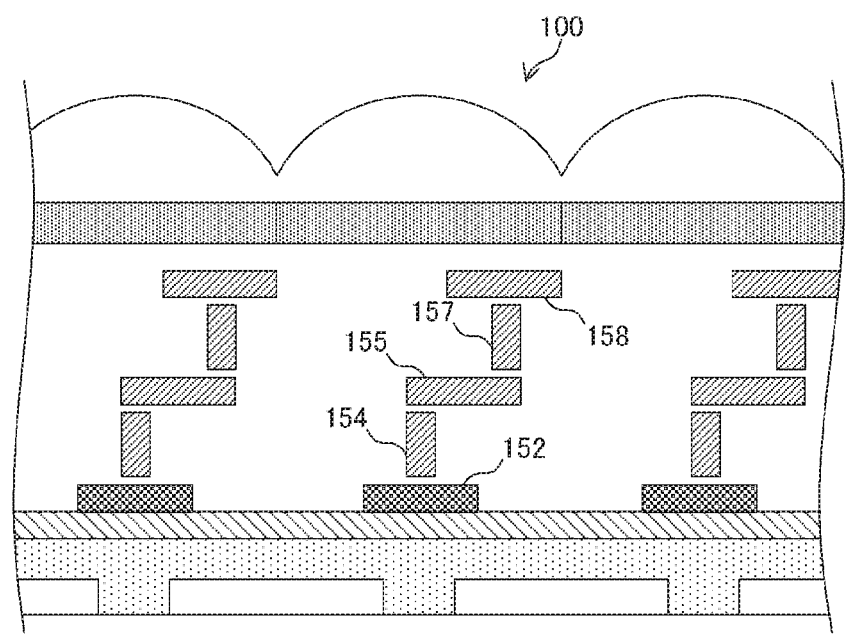

FIG. 10 illustrates a configuration example of the pixel according to a second modification of the first embodiment of the present disclosure.

Figure 11A:
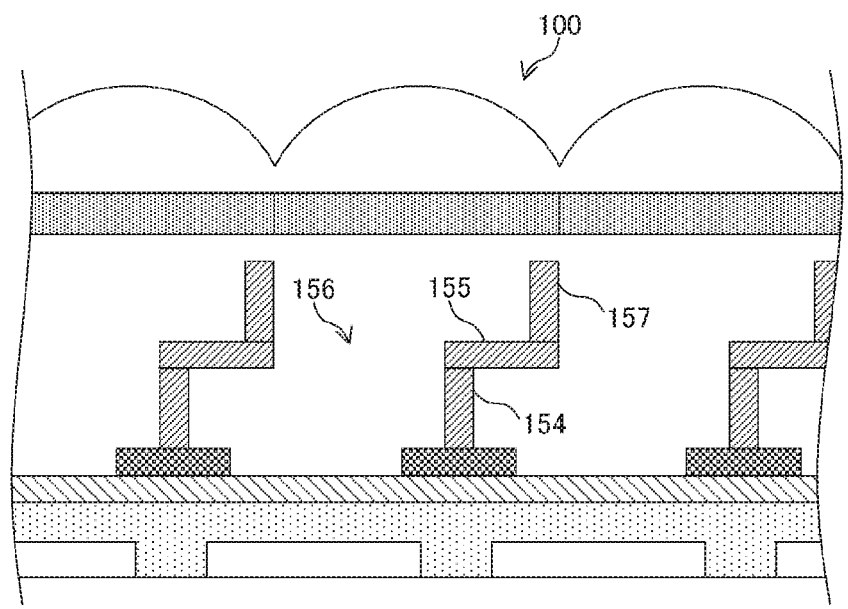
Figure 11B:
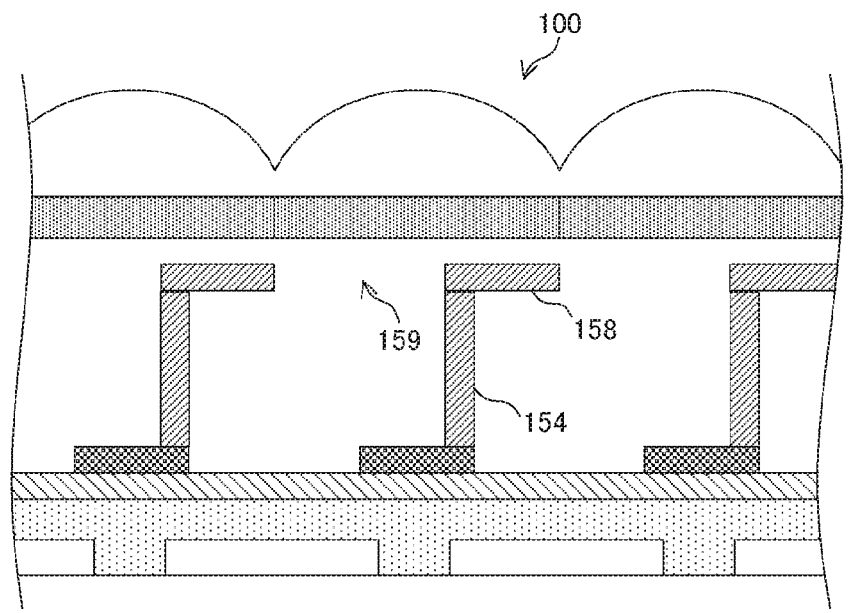

FIGS. 11A and 11B illustrate a configuration example of the pixel according to a third modification of the first embodiment of the present disclosure.

Figure 12:
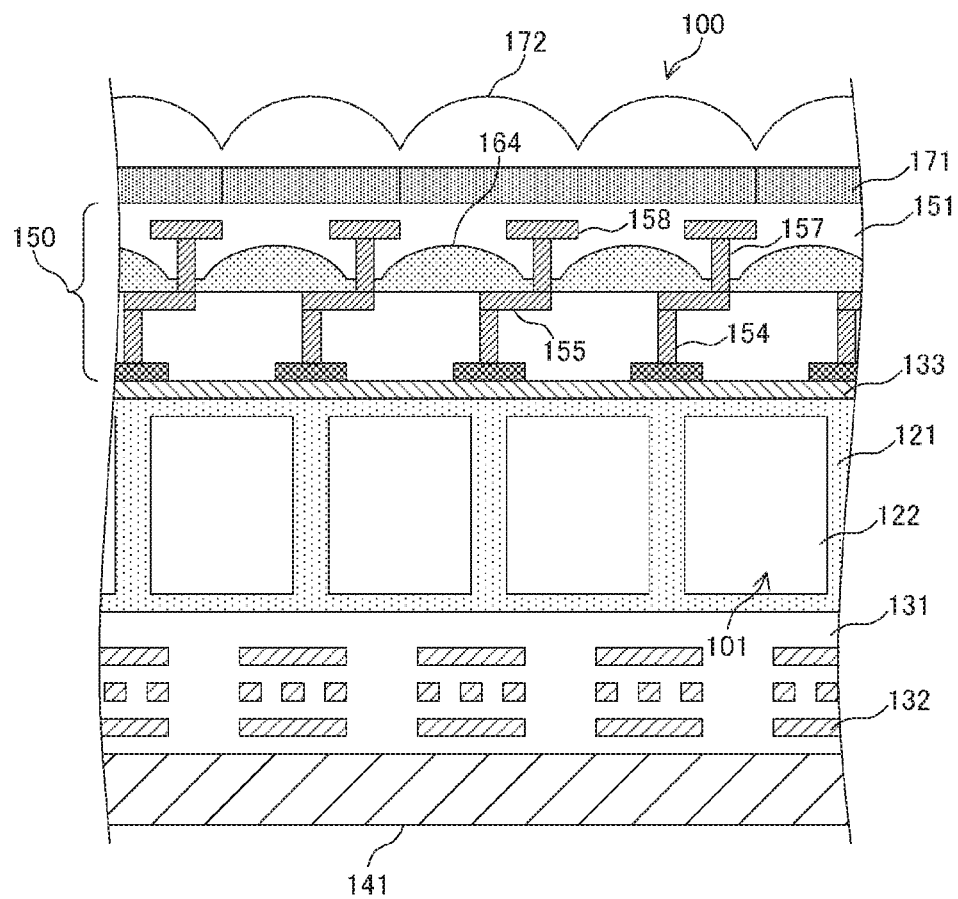

FIG. 12 illustrates a configuration example of the pixel according to a second embodiment of the present disclosure.

Figure 13A:
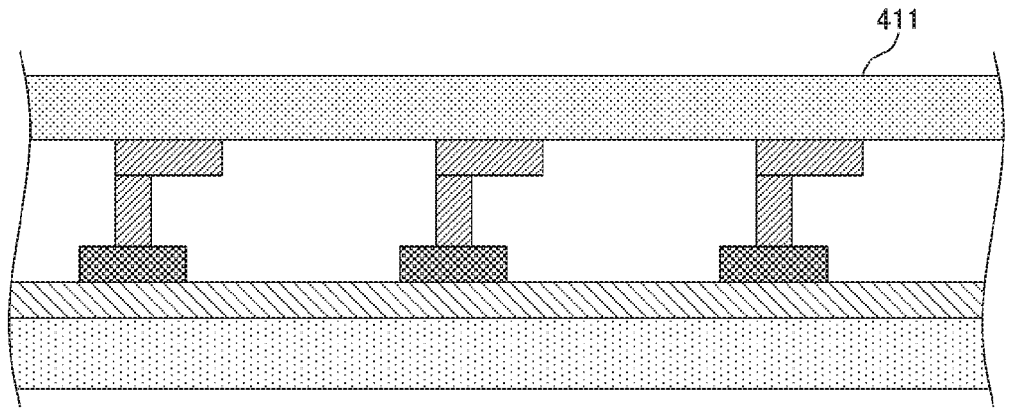
Figure 13B:
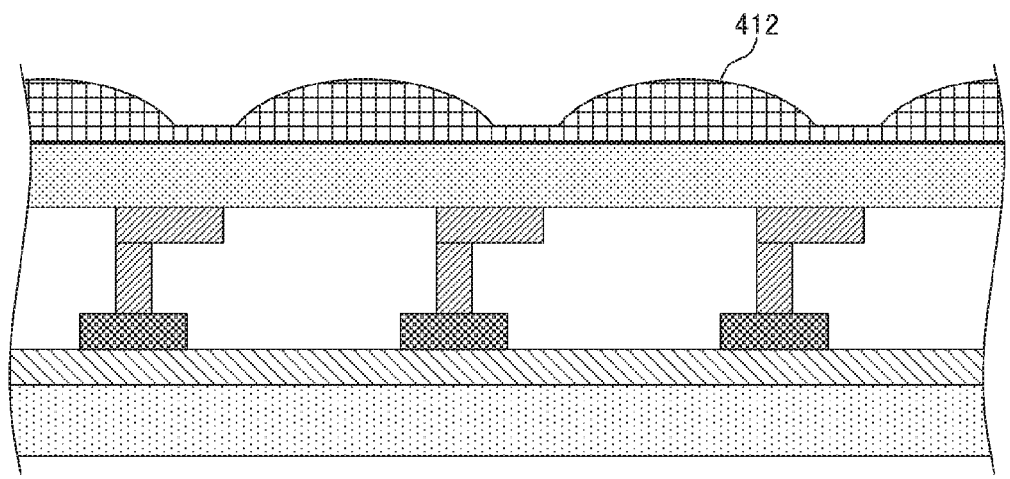
Figure 13C:
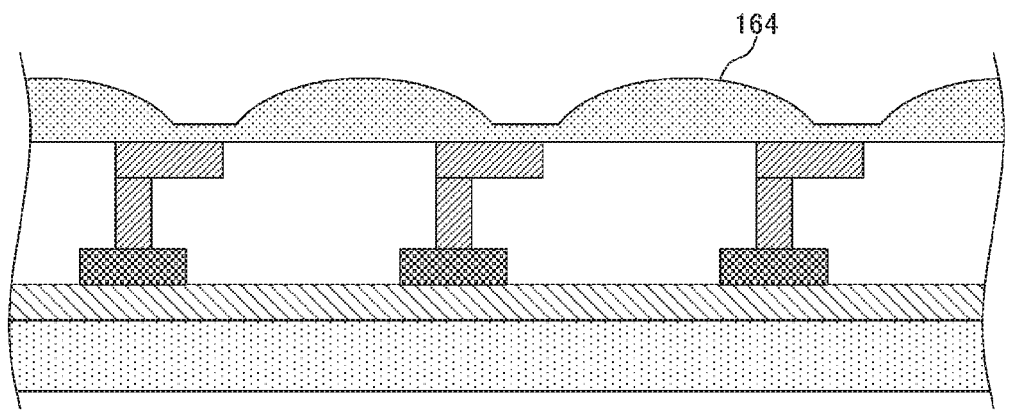

FIGS. 13A, 13B, and 13C illustrate an example of a method of manufacturing the imaging device according to the second embodiment of the present disclosure.

Figure 14A:
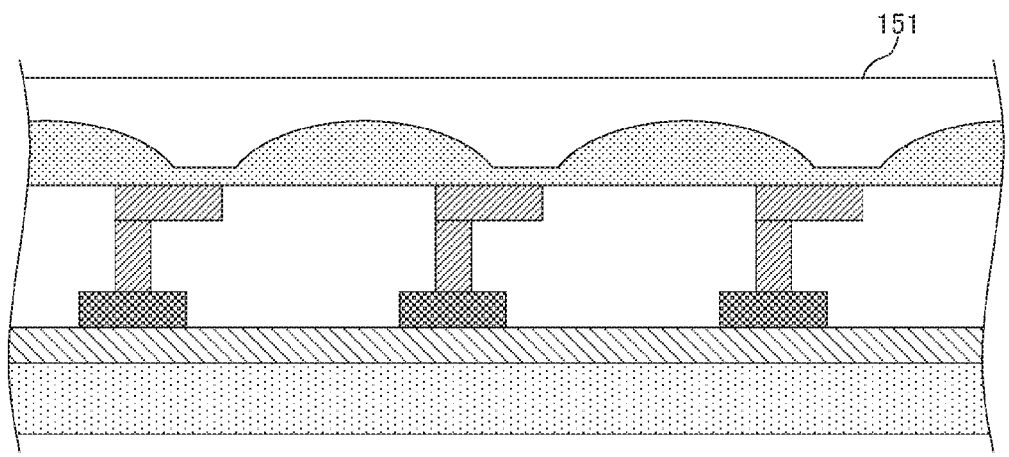
Figure 14B:
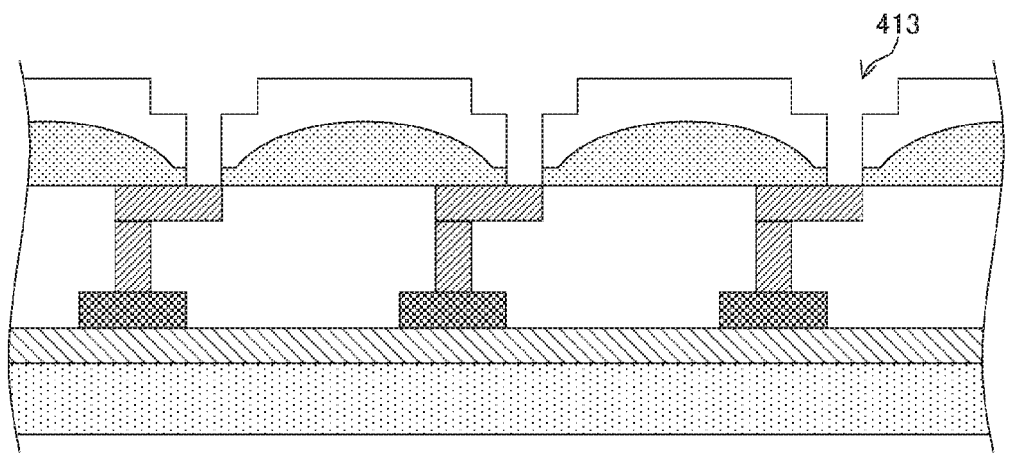
Figure 14C:
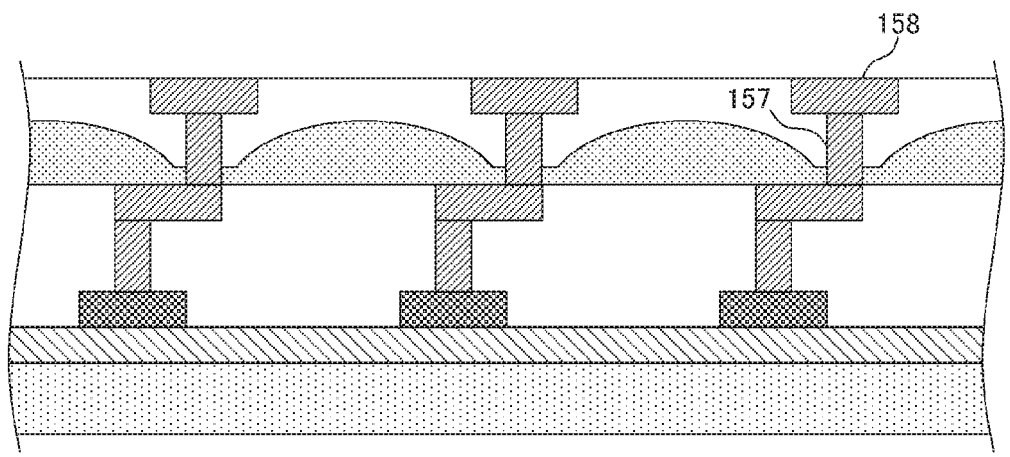

FIGS. 14A, 14B, and 14C illustrate the example of the method of manufacturing the imaging device according to the second embodiment of the present disclosure.

Figure 15:
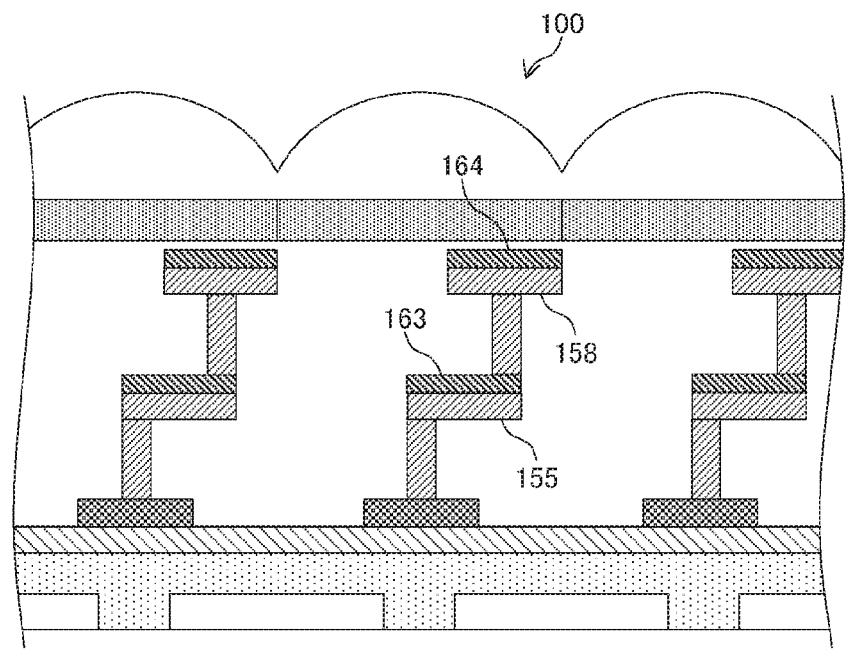

FIG. 15 illustrates a configuration example of a pixel according to a third embodiment of the present disclosure.

Figure 16:
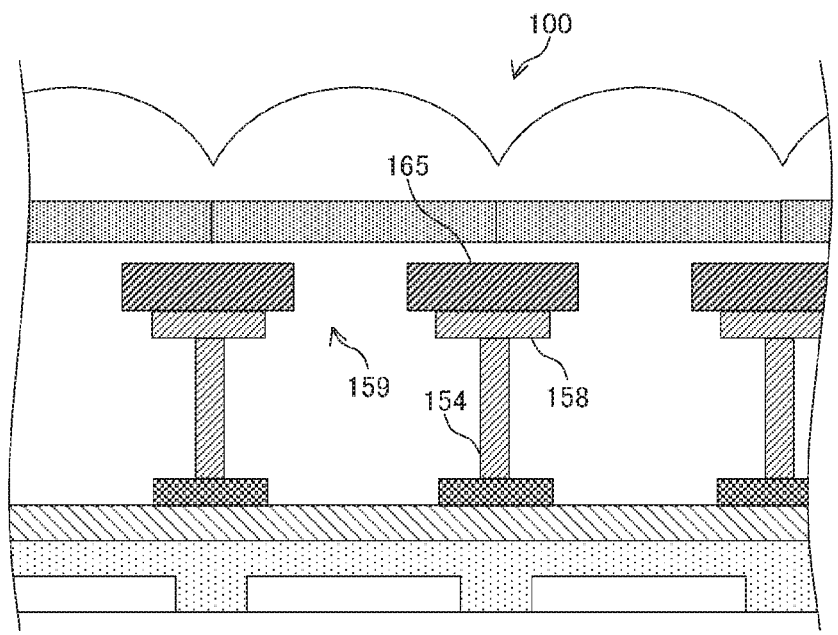

FIG. 16 illustrates a configuration example of a pixel according to a fourth embodiment of the present disclosure.

Figure 17:
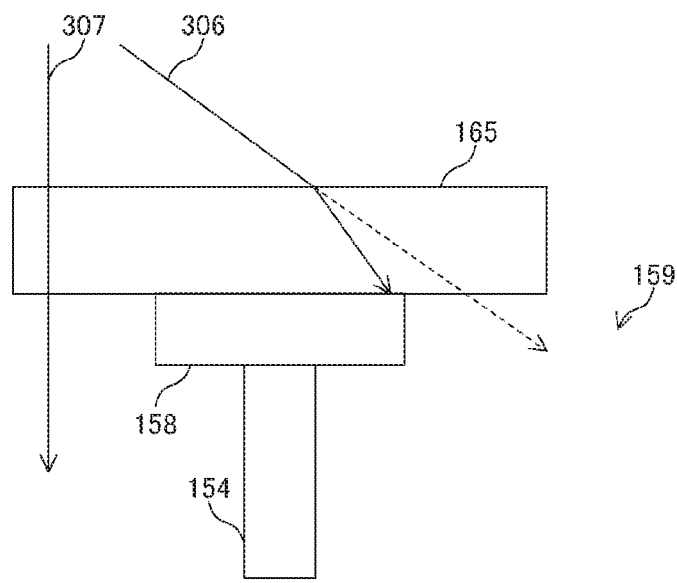

FIG. 17 illustrates an example of light collection according to the fourth embodiment of the present disclosure.

Figure 18:
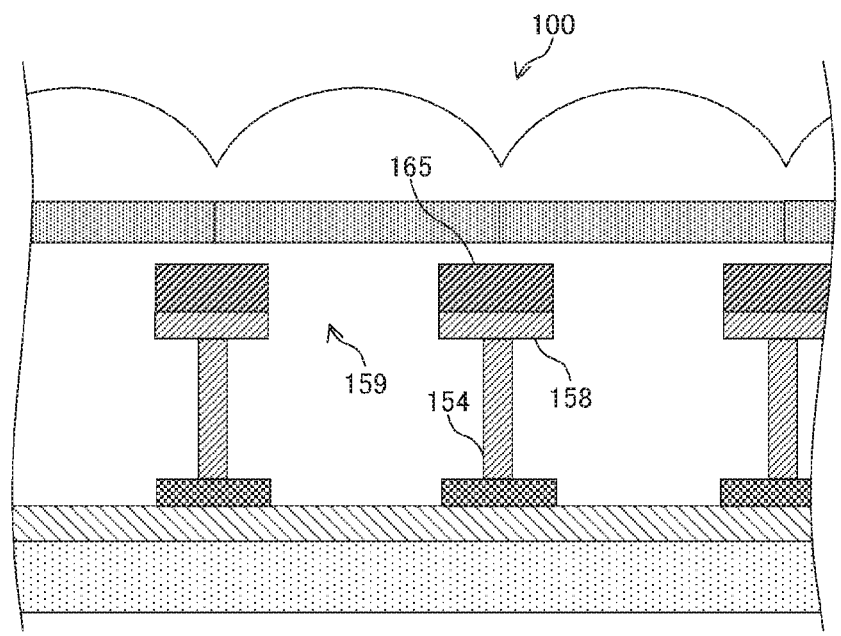

FIG. 18 illustrates another configuration example of the pixel according to the fourth embodiment of the present disclosure.

Figure 19:
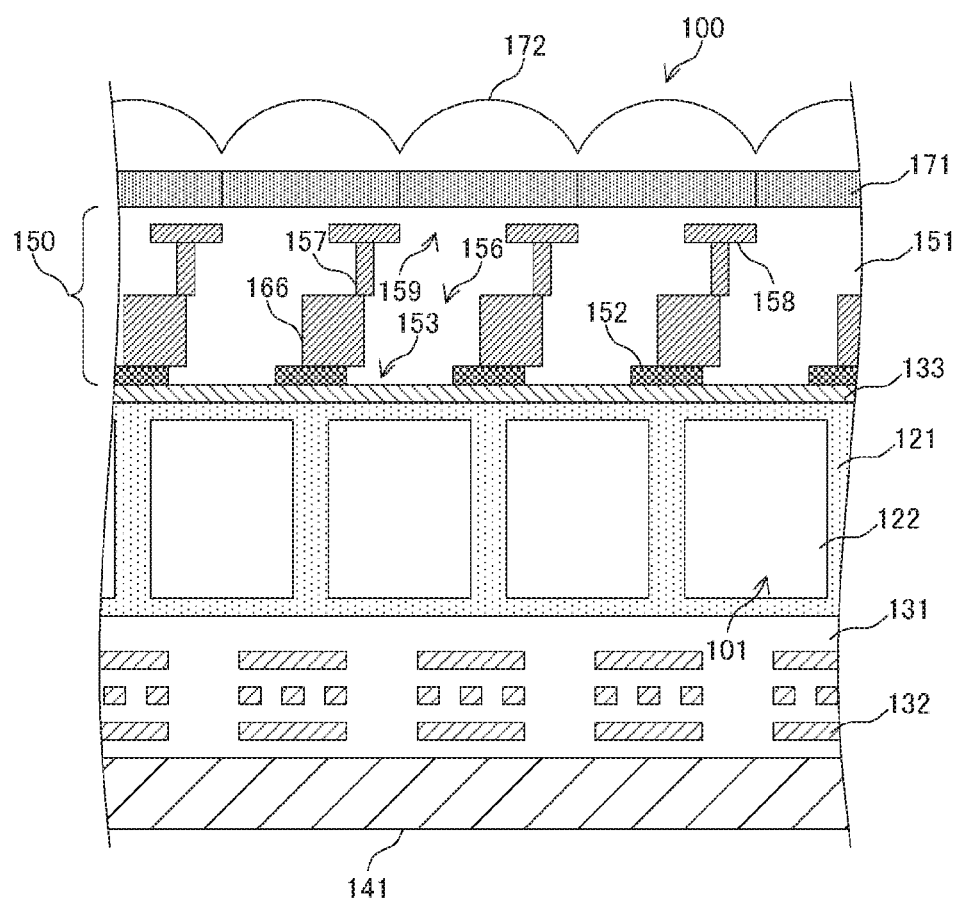

FIG. 19 illustrates a configuration example of a pixel according to a fifth embodiment of the present disclosure.

Figure 20:
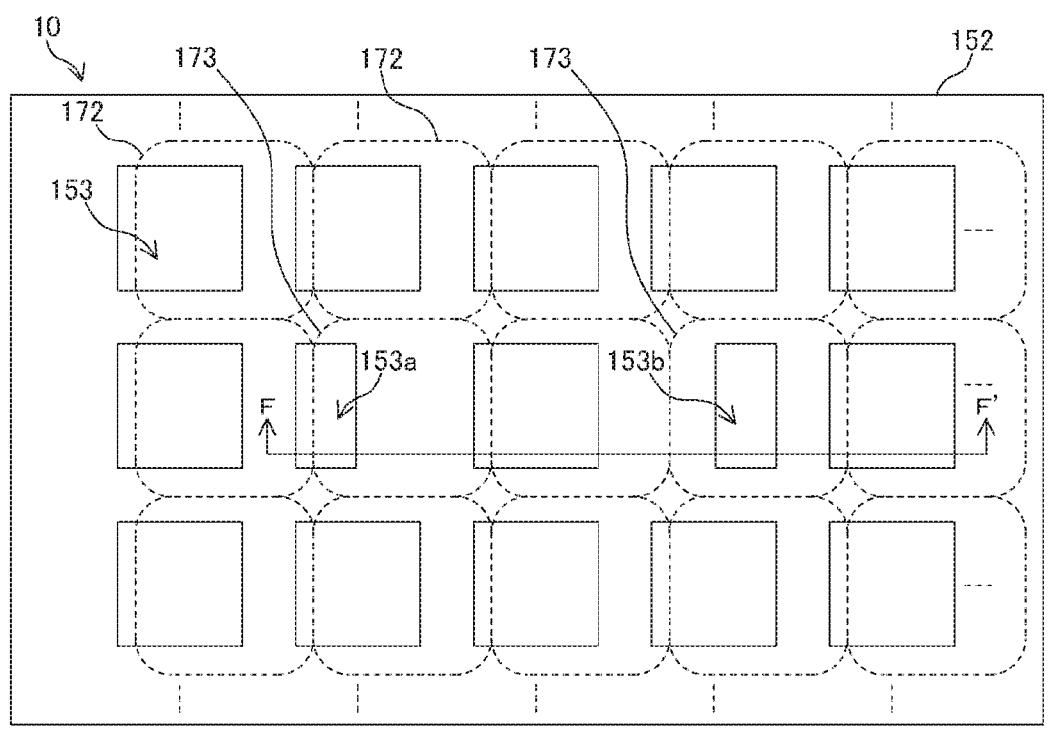

FIG. 20 illustrates a configuration example of a pixel array according to a sixth embodiment of the present disclosure.

Figure 21:
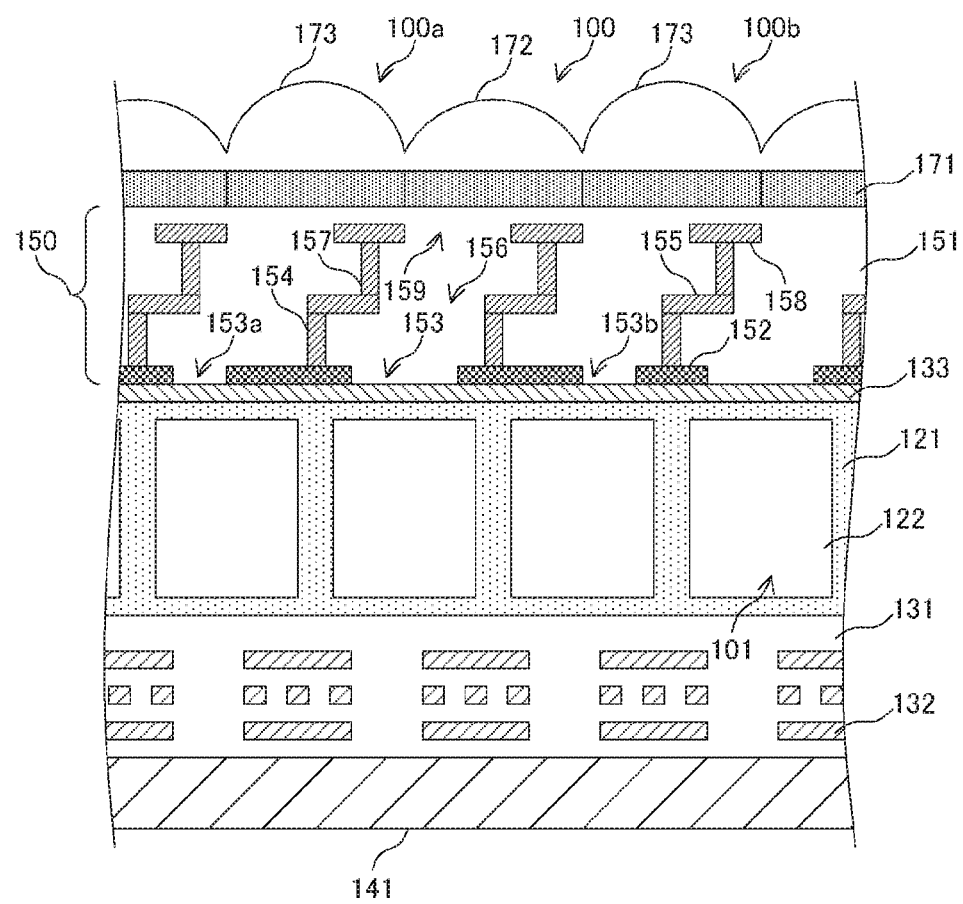

FIG. 21 illustrates a configuration example of a pixel according to the sixth embodiment of the present disclosure.

Figure 22A:
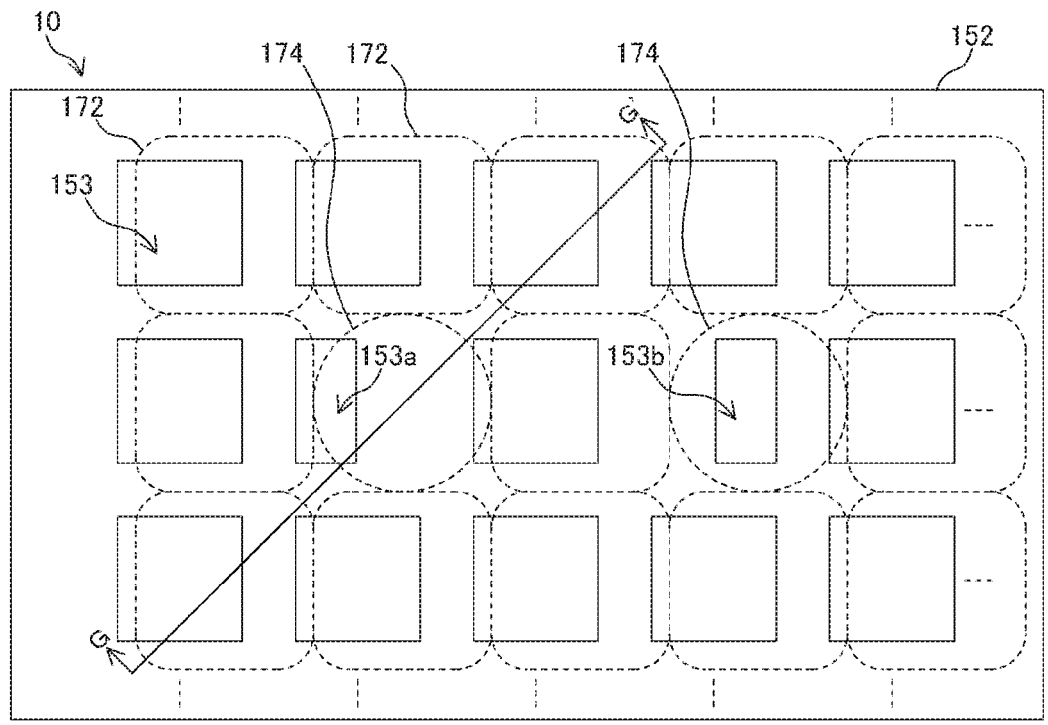
Figure 22B:
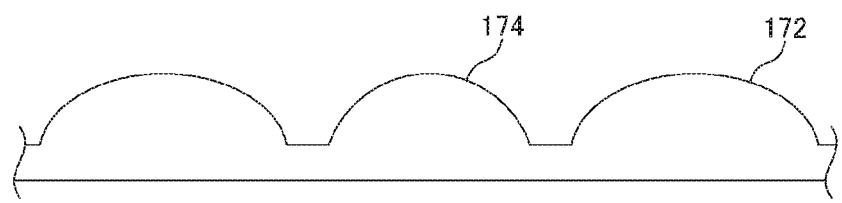

FIGS. 22A and 22B illustrate another configuration example of the pixel array according to the sixth embodiment of the present disclosure.

MODE(S) FOR CARRYING OUT THE INVENTION

Next, modes for carrying out the present disclosure (hereinafter referred to as embodiments) will be described with reference to the drawings. In the accompanying drawings, the same or similar portions will be denoted by the same or similar reference symbols. However, the figures are schematic ones, and, for example, a ratio of dimensions of respective components is not necessarily the same as the actual one. Further, of course, a certain figure and another figure have different dimensional relationships and different ratios of dimensions with respect to the same portion. The embodiments will be described in the following order.
1. First Embodiment
2. Second Embodiment
3. Third Embodiment
4. Fourth Embodiment
5. Fifth Embodiment
6. Sixth Embodiment
7. Example of Application to Camera 1. First Embodiment

[Configuration of Imaging Device]

Figure 1:
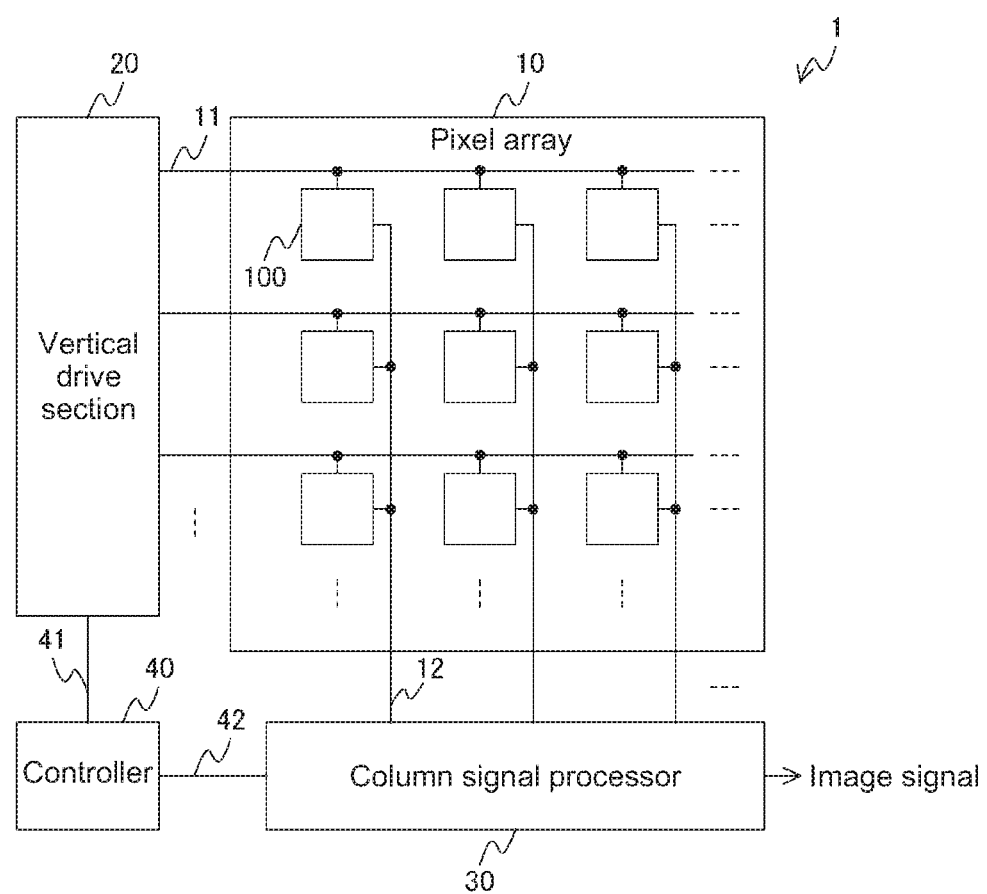
FIG. 1 illustrates a configuration example of an imaging device according to embodiments of the present disclosure.

FIG. 1 illustrates a configuration example of an imaging device according to embodiments of the present disclosure. An imaging device 1 in the figure includes a pixel array 10, a vertical drive section 20, a column signal processor 30, and a controller 40.

The pixel array 10 includes pixels 100 arranged in a two-dimensional grid. Here, the pixel 100 generates an image signal depending on irradiated light. The pixel 100 includes a photoelectric converter that generates an electric charge depending on irradiated light. The pixel 100 further includes a pixel circuit. The pixel circuit generates an image signal based on an electric charge generated by the photoelectric converter. The generation of an image signal is controlled by a control signal generated by the vertical drive section 20 described later. The pixel array 10 includes signal lines 11 and 12 arranged in an XY matrix. The signal line 11 is a signal line that transmits a control signal for the pixel circuit in the pixel 100. The signal line 11 is arranged for each row of the pixel array 10 and wired in common with respect to the pixels 100 arranged in each row. The signal line 12 is a signal line that transmits an image signal generated by the pixel circuit of the pixel 100. The signal line 12 is arranged for each column of the pixel array 10 and wired in common with respect to the pixels 100 arranged in each column. The photoelectric converter and the pixel circuit are formed on a semiconductor substrate.

The vertical drive section 20 generates a control signal for the pixel circuit of the pixel 100. The vertical drive section 20 transmits the generated control signal to the pixel 100 through the signal line 11 in the figure. The column signal processor 30 processes an image signal generated by the pixel 100. The column signal processor 30 processes the image signal transmitted from the pixel 100 through the signal line 12 in the figure. The processing performed by the column signal processor 30 corresponds to, for example, an analog-to-digital conversion that converts an analog image signal generated in the pixel 100 into a digital image signal. The image signal processed by the column signal processor 30 is output as an image signal of the imaging device 1. The controller 40 controls the entire imaging device 1. The controller 40 controls the imaging device 1 by generating and outputting a control signal used to control the vertical drive section 20 and the column signal processor 30. The control signal generated by the controller 40 is transmitted to the vertical drive section 20 and the column signal processor 30 respectively through signal lines 41 and 42.

[Configuration of Pixel]

Figure 2:
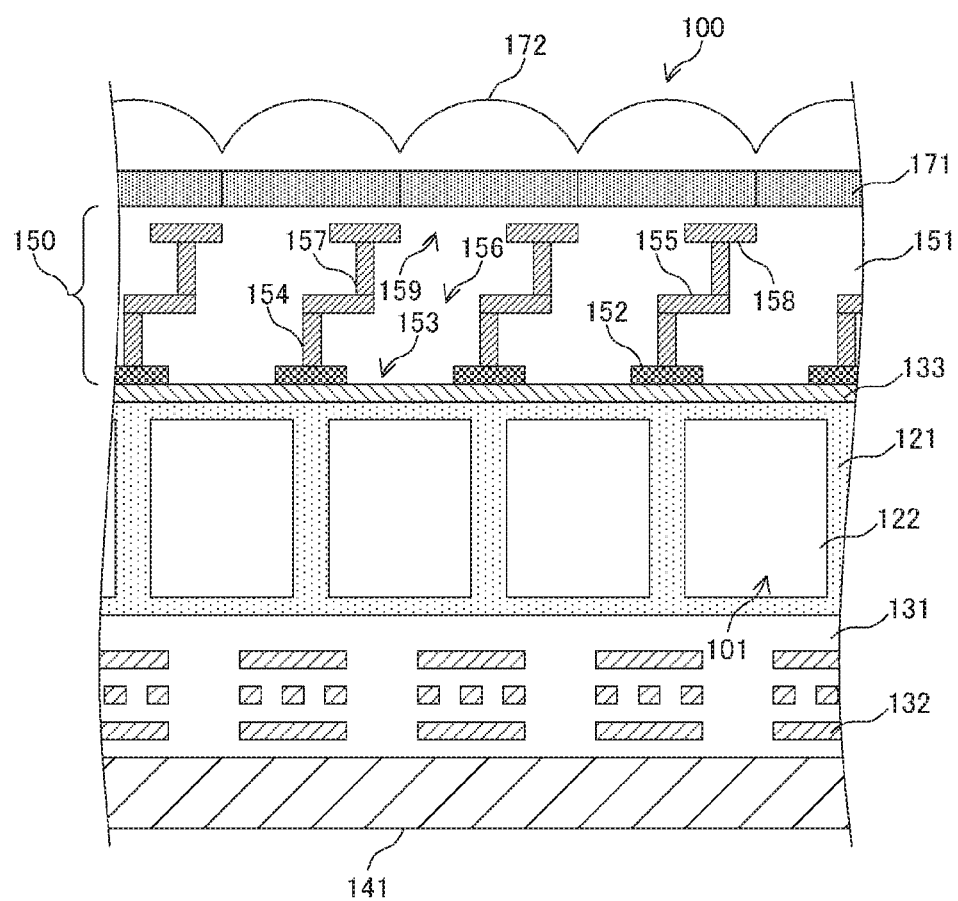
FIG. 2 illustrates a configuration example of a pixel according to a first embodiment of the present disclosure.

FIG. 2 illustrates a configuration example of a pixel according to a first embodiment of the present disclosure. The figure is a schematic cross-sectional view illustrating a configuration example of a plurality of pixels 100 in the pixel array 10 described in FIG. 1. The pixel 100 in the figure includes a semiconductor substrate 121, a wiring region formed of an insulation layer 131 and a wiring layer 132, and an insulation film 133. The pixel 100 in the figure further includes a light-blocking layer 152, a light path portion 150, a color filter 171, and an on-chip lens 172.

The semiconductor substrate 121 is a semiconductor substrate on which a semiconductor region portion of elements included in the pixel circuit described in FIG. 1 is formed. The element of the pixel circuit is formed in a well region formed on the semiconductor substrate 121. For convenience, it is assumed that the semiconductor substrate 121 in the figure is formed of a p-type well region. The figure illustrates a photoelectric converter (a photoelectric converter 101) from among the elements of the pixel circuit. The photoelectric converter 101 in the figure is formed of an n-type semiconductor region 122 and a p-type well region surrounding the n-type semiconductor region 122. When incident light is irradiated onto a p-n junction between the n-type semiconductor region 122 and the p-type well region, photoelectric conversion is performed. An electric charge generated by the photoelectric conversion is converted into an image signal by the pixel circuit (not illustrated). As described above, the photoelectric converter 101 is arranged for each pixel 100. Note that semiconductor region portions of the vertical drive section 20, the column signal processor 30, and the controller 40 described in FIG. 1 are further formed on the semiconductor substrate 121.

The wiring layer 132 establishes connection among semiconductor elements in the pixel 100. Further, the wiring layer 132 is also used to connect the pixel 100 to an external circuit, and makes up the signal lines 11 and 12 described in FIG. 1. The wiring layer 132 may be made of, for example, metal such as copper (Cu). The insulation layer 131 insulates the wiring layer 132. For example, silicon oxide ($SiO_2$) may be used for the insulation layer 131. The insulation layer 131 and the wiring layer 132 are formed adjacent to each other on a front surface of the semiconductor substrate 121, and form the wiring region. A support substrate 141 is arranged adjacent to the wiring region. The support substrate 141 is a substrate that supports the imaging device 1, and improves the strength of the imaging device 1 upon manufacturing the imaging device 1.

The insulation film 133 is a film that is formed on a back surface of the semiconductor substrate 121 and insulates the semiconductor substrate 121. The insulation film is formed of, for example, a hafnium-oxide ($HfO_2$) film and an $SiO_2$ film, and can isolate the semiconductor substrate 121 and prevent the reflection of incident light. Note that the imaging device 1 in the figure corresponds to a back-surface-type imaging device in which incident light is irradiated onto the photoelectric converter 101 from the back surface of the semiconductor substrate 121.

The light-blocking layer 152 is arranged adjacent to the insulation film 133 and blocks incident light. The light-blocking layer 152 is arranged between pixels 100 and blocks incident light entering from adjacent pixels 100. The light-blocking film 152 can be made of light-blocking material such as aluminum (Al), tungsten (W), Cu, and an alloy thereof. Further, titanium (Ti) or titanium nitride (TiN) may also be used as an underlying metal thereof. An opening 153 is arranged in the light-blocking layer 152 in the figure. Incident light is irradiated onto the photoelectric converter 101 through the opening 153. Note that a black-level calculation pixel (not illustrated) that is a pixel used to calculate the black level of an image signal is arranged around the pixel 100 in the figure. In the black-level calculation pixel, the opening 153 is omitted, and all of the pieces of incident light are blocked by the light-blocking layer 152.

The on-chip lens 172 is a lens that is arranged for each pixel 100 and collects incident light. The on-chip lens 172 collects incident light into the photoelectric converter 101 through the color filter 171 and the light path portion 150 described later. The on-chip lens 172 is arranged in a state of being shifted with respect to the center of the photoelectric converter 101 (the n-type semiconductor region 122). This is for performing the pupil correction described above. The pixel 100 in the figure is an example of the pixel 100 arranged on the left with respect to an optical center of the pixel array 10. Thus, due to pupil correction, the on-chip lens 172 in the figure is arranged in a state of being shifted in the right direction in the figure with respect to the center of the photoelectric converter 101. The on-chip lens 172 can be made of organic material such as a styrene resin, an acrylic resin, a styrene-acrylic copolymer resin, and a siloxane resin. Further, the on-chip lens 172 can also be made of inorganic material such as silicon nitride (SiN) and silicon oxynitride (SiON). An antireflective film may be arranged on the surface of the on-chip lens 172.

The color filter 171 is an optical filter that is arranged for each pixel 100 and through which light of a specified wavelength from among incident light is transmitted. The color filters 171 through which red light, green light and blue light are respectively transmitted can be used as the color filter 171. Note that pupil correction is also performed with respect to the color filter 171. As in the case of the on-chip lens 172, the color filter 171 is arranged in a state of being shifted in the right direction in the figure with respect to the center of the photoelectric converter 101. Note that the amount of pupil correction with respect to the color filter 171 and the on-chip lens 172 varies depending on an incident angle of incident light. Specifically, the amount of pupil correction varies depending on a distance from the optical center of the pixel array 10, and is larger at a position closer to the end. Note that, although an example of the imaging device 1 including the color filter 171 is described here, the imaging device 1 may have a configuration in which the color filter 171 is omitted. For example, in the case of a black-and-white imaging device used in a three-CCD camera or the like, it is also possible to suppress crosstalk by arranging the light path portion 150.

The light path portion 150 is a region in which a light path of incident light is formed. The light path portion 150 in the figure is arranged on the back surface of the semiconductor substrate 121, and blocks incident light collected by the on-chip lens 172 from leaking to an adjacent pixel. The light path portion 150 includes a transparent film 151, light-blocking walls 154 and 157, and light-blocking films 155 and 158. The light path portion 150 in the figure collects, into the photoelectric converter 101, incident light obliquely entering through the on-chip lens 172 and the color filter 171 that are each arranged in a state of being shifted due to pupil correction, while preventing the occurrence of optical vignetting.

The transparent film 151 is a film through which incident light is transmitted. The transparent film 151 can be formed of, for example, a film of oxide such as $SiO_2$. Further, the transparent film 151 can also be used as a planarized film, in which a surface of the planarized film on which the color filter 171 is formed is planarized.

The light-blocking walls 154 and 157 partition, for each pixel 100, the transparent film 151 in a direction perpendicular to the semiconductor substrate 121, and block light.

A plurality of light-blocking walls 154 and the like can be arranged in the light path portion 150. The figure illustrates an example of arranging two light-blocking walls 154 and 157. As in the case of the light-blocking layer 152, the light-blocking walls 154 and 157 can be made of light-blocking metal or the like.

The light-blocking films 155 and 158 each have a film shape parallel to the semiconductor substrate 121, and block incident light. Openings 156 and 159 are respectively arranged in the light-blocking films 155 and 158. The openings 156 and 159 are arranged for each pixel 100, and incident light is collected into the photoelectric converter 101 through the openings 156 and 159. As illustrated in the figure, the light-blocking films 155 and 158 are respectively arranged near ends of the light-blocking walls 154 and 157, the ends being respectively situated opposite to ends of the light-blocking walls 154 and 157 that are situated closer to the semiconductor substrate 121. The figure illustrates an example in which the light-blocking film 155 and the light-blocking wall 154 are arranged adjacent to each other, and the light-blocking film 158 and the light-blocking wall 157 are arranged adjacent to each other. As in the case of the light-blocking layer 152, the light-blocking films 155 and 158 can be made of light-blocking metal or the like. Further, when the light-blocking film 155 is made of the same material as the light-blocking wall 154, it is possible to form the light-blocking film 155 and the light-blocking wall 154 at the same time. When the light-blocking film 158 and the light-blocking wall 157 are made of the same material, it is also possible to form the light-blocking film 158 and the light-blocking wall 157 at the same time.

As illustrated in the figure, the light-blocking wall 157, the opening 156 of the light-blocking film 155, and the opening 159 of the light-blocking film 158 can each be arranged in a state of being shifted with respect to the center of the photoelectric converter 101. This is for performing pupil correction as in the cases of the on-chip lens 172 and the color filter 171. The amount of pupil correction varies depending on an incident angle of incident light. In general, the amount of pupil correction is larger at a position further away from the optical center of the pixel array 10. This makes it possible to collect, into the photoelectric converter 101, incident light obliquely entering through the on-chip lens 172 and the color filter 171 that are each arranged in a state of being shifted due to pupil correction. Note that, as in the case of the light-blocking wall 157, the light-blocking wall 154 can also be arranged in a state of being shifted with respect to the center of the photoelectric converter 101. In this case, it is possible to arrange the light-blocking wall 157 in a state of being shifted more greatly than the light-blocking wall 154. This is for causing an optical route of the light-collecting structure to have a substantially rectangular shape in parallel with an oblique optical axis of incident light.

Note that the configuration of the imaging device 1 is not limited to this example. For example, it is possible to arrange the light-blocking wall and the light-blocking film in three or more stages. Further, it is also possible to omit pupil correction.

[Function of Light Path Portion]

Figure 3A:
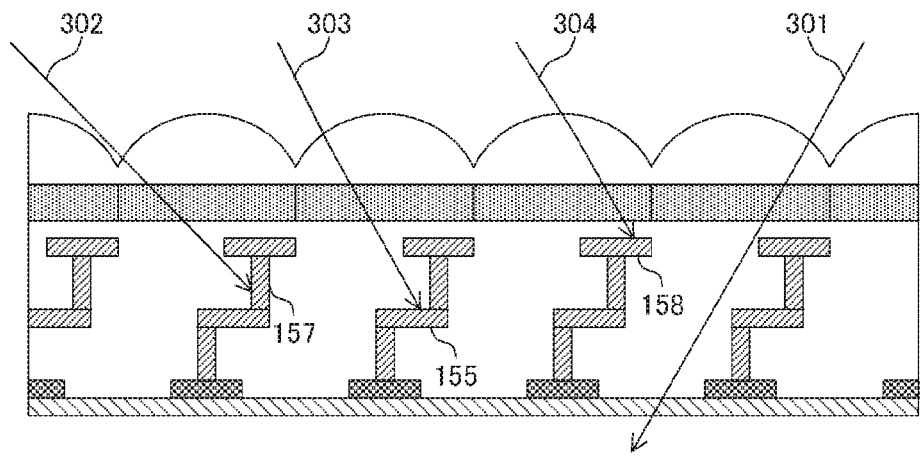
FIGS. 3A and 3B illustrate an example of a function of a light path portion according to the first embodiment of the present disclosure.
Figure 3B:
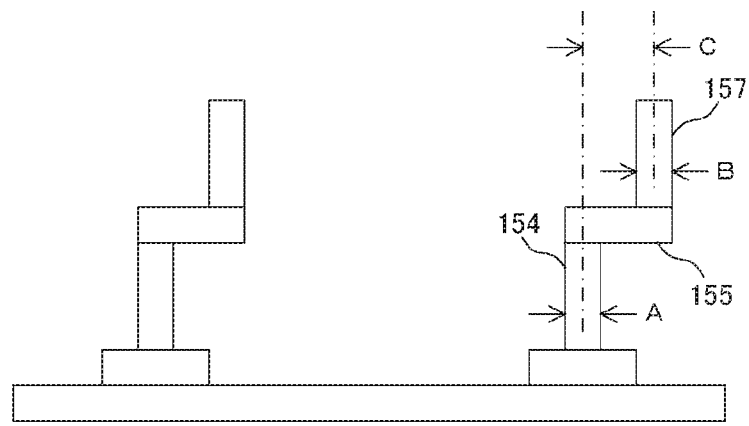

FIGS. 3A and 3B illustrate an example of a function of the light path portion according to the first embodiment of the present disclosure. FIG. 3A illustrates a state of light-blocking performed in the light path portion 150 described in FIG. 2. In FIG. 3A, an arrow represents incident light entering the imaging device 1. Incident light 301 in a direction corresponding to pupil correction is transmitted through the light path portion 150, and reaches the photoelectric converter 101. On the other hand, a component of stray light that is light other than normal light with which an imaging lens of a camera forms an image of a subject is blocked by the light-blocking wall 157 and the like. In other words, incident light 302 obliquely entering from the left in FIG. 3A is blocked by the light-blocking wall 157. Likewise, incident light 303 and incident light 304 are respectively blocked by the light-blocking films 155 and 158. The light-blocking films 158 and 155 respectively serve as diaphragms respectively arranged at an entrance of the light path and in the middle of the light path, and block stray light.

FIG. 3B illustrates a relationship between an amount of pupil correction, and the light-blocking walls 154 and 157 and the light-blocking film 155. In FIG. 3B, "A" and "B" respectively represent a width of the light-blocking wall 154 and a width of the light-blocking wall 157. "C" represents an amount of pupil correction with respect to the light-blocking wall 157. As illustrated in FIG. 3B, when the amount of pupil correction C is larger than (A/2)+(B/2), a gap is created in a boundary between the light-blocking walls 154 and 157 of the light-blocking portion described above. It is not possible to block the incident light 303 in FIG. 3A, and this results in crosstalk. The arrangement of the light-blocking film 155 makes it possible to cover the gap of the light-blocking portion, and to improve a light-blocking performance in blocking incident light from a direction different from the direction corresponding to the pupil correction. Note that it is favorable that the light-blocking film 155 have a width that compensates for a difference between the pupil correction amount (A/2)+(B/2) of pupil correction in the lower light-blocking wall 154 and the upper light-blocking wall 157, and a desired amount of pupil correction C, and the width of the light-blocking film 155 be changed depending on an image height. Here, the light-blocking film 155 may be omitted in the pixel 100 having an image height in which the light-blocking wall 154 and the light-blocking wall 157 are adjacent to each other, such as near an image height center.

[Configuration of Light-Blocking Film]

FIGS. 4A, 4B, and 4C illustrate a configuration example of the light-blocking film according to the first embodiment of the present disclosure. The figure is a plan view illustrating a configuration example of the openings 156 and 159 in the light-blocking films 155 and 158 for each pixel 100. The configuration is described using the light-blocking film 158 as an example. Note that it is possible to improve a light-blocking performance in blocking stray light by reducing the area of, for example, the opening 159. On the other hand, when the area of, for example, the opening 159 is reduced, there is an increase in an amount of blocking normal light, and this results in a reduction in the sensitivity of the pixel 100. It is desirable to design, for example, the opening 159 in consideration of such a condition.

FIG. 4A illustrates the light-blocking film 158 with the opening 159 having a rectangular shape. In FIG. 4A, it is easy to create a reticle due to the rectangular shape, but a size E in a diagonal direction of the opening 159 is larger than a size D in a side direction of the opening 159. Thus, there is a problem in which there is a reduction in a light-blocking performance in blocking incident light obliquely entering a region of a corner of the light-blocking film 158.

FIG. 4B illustrates the light-blocking film 158 with the opening 159 having an octangular shape. Unlike the light-blocking film 158 in FIG. 4A, the size in a diagonal direction of the opening 159 in FIG. 4B is also D. Thus, it is possible to prevent a decrease in a light-blocking performance in blocking incident light obliquely entering a region of a corner of the light-blocking film 158. A reticle in which a figure (the shape of the opening) having a component in a 45-degree direction is arranged, is disadvantageous in that, upon creating the reticle, the number of rectangular divisions of data in an electron-beam lithography system is increased and the processing time is increased. However, this does not prevent the creation of a reticle.

FIG. 4C illustrates the light-blocking film 158 with the opening 159 having a circular shape. As in the case of the light-blocking film 158 in FIG. 4B, it is possible to prevent a decrease in a light-blocking performance in blocking incident light obliquely entering a region of a corner of the light-blocking film 158. With respect to a reticle in which a circular figure is arranged, the processing time upon creating the reticle is also increased. However, this does not prevent the creation of a reticle.

[Method of Manufacturing Imaging Device]

Figure 5A:
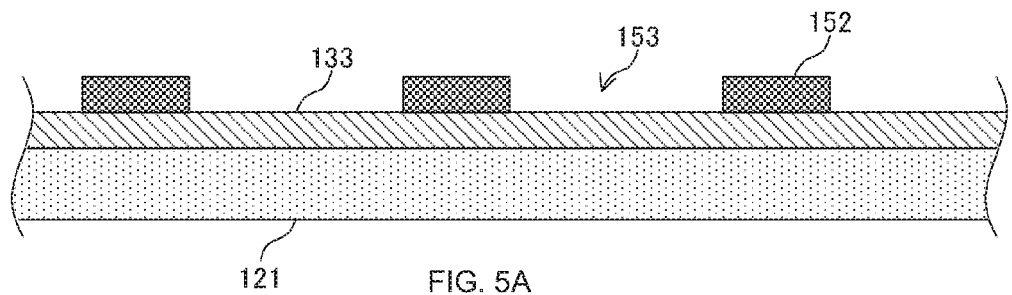

FIGS. 5A, 5B, 5C, 5D, 6A, 6B, 6C, 7A, 7B, and 7C illustrate an example of a method of manufacturing the imaging device according to the first embodiment of the present disclosure. First, a p-type well region, the n-type semiconductor region 122, and the like are formed, and the photoelectric converter 101 and the like are formed on the semiconductor substrate 121. A wiring region is formed on the surface of the semiconductor substrate 121. After the support substrate 141 is bonded, the semiconductor substrate 121 is turned upside down, and the back surface of the semiconductor substrate 121 is ground to be thin. The insulation film 133 is formed on the back surface of the semiconductor substrate 121. Note that the semiconductor substrate 121 having a simplified configuration is illustrated in the figure. Next, the light-blocking layer 152 is formed. This can be performed by, for example, forming a metal film used as material of the light-blocking layer 152 using chemical vapor deposition (CVD) or the like and performing etching on the metal film of the opening 153 (FIG. 5A).

Figure 5B:
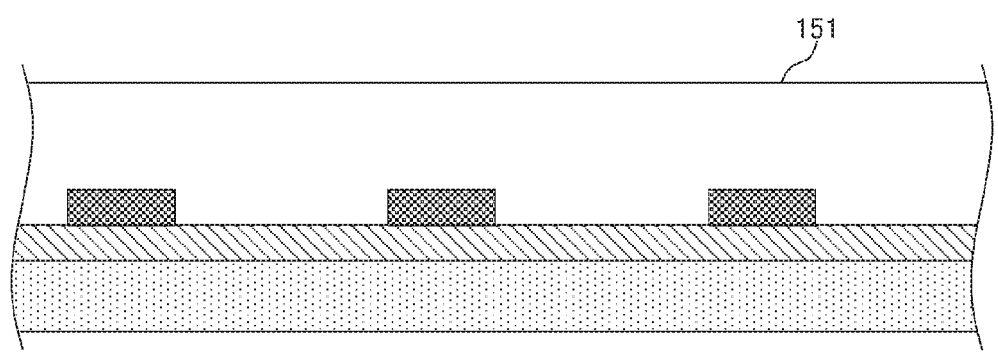

Next, the transparent film 151 is formed on the insulation film 133 and the light-blocking layer 152. This can be performed by forming a film of oxide that is material of the transparent film 151 and planarizing a surface of the transparent film 151 using chemical mechanical polishing (CMP) (FIG. 5B). Note that the process of a of FIG. 5A corresponds to forming a transparent film according to an embodiment of the present disclosure.

Figure 5C:
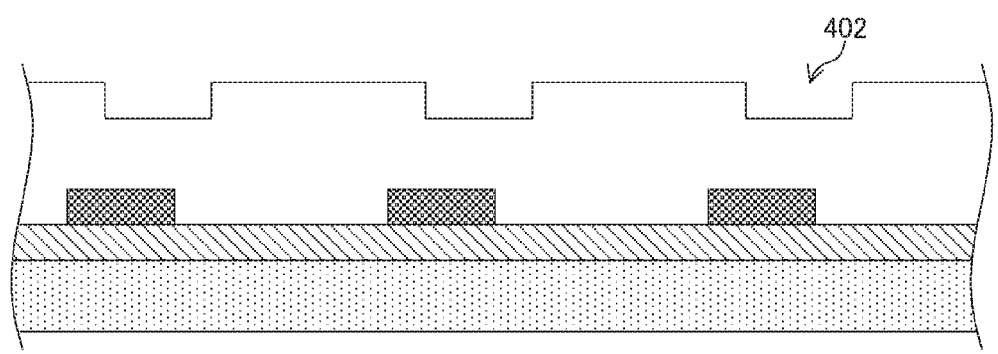
Figure 5D:
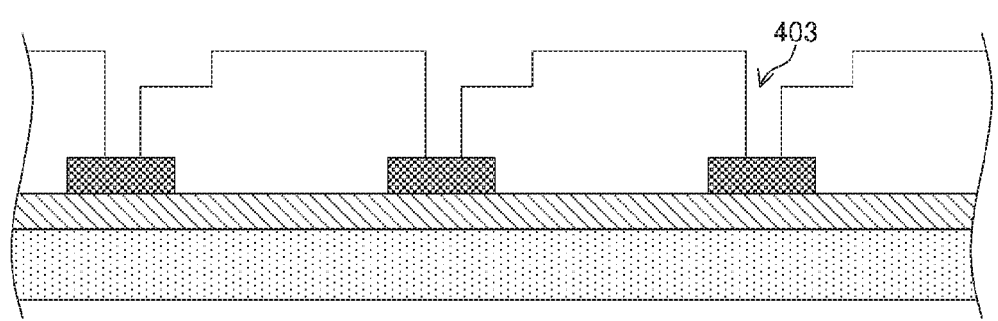

Next, a relatively shallow concave 402 is formed on the surface of the transparent film 151. This can be performed by forming, on the transparent film 151, a resist including an opening at the position of the concave 402 and performing dry etching using the resist as a mask (FIG. 5C). Next, a concave 403 is formed by performing etching on an end of the concave 402. The concave 403 has a shape that is narrower in width and deeper in depth than the concave 402 (FIG. 5D). Next, a metal film 404 is formed that is material of the light-blocking wall 154 and the light-blocking film 155. Here, metal is arranged in the concaves 402 and 403 (FIG. 6A). Next, a surface of the metal film 404 is ground using CMP or by performing etching. This makes it possible to form the light-blocking wall 154 and the light-blocking film 155 at the same time (FIG. 6B). Note that the processes of FIGS. 5C and 5D and the processes of FIGS. 6A and 6B correspond to forming a light-blocking wall and forming a light-blocking film according to an embodiment of the present disclosure.

Next, the transparent film 151 is stacked thereon such that the transparent film 151 becomes thicker (FIG. 6C). Next, a concave 405 is formed in the transparent film 151. As in the case of FIGS. 5C and 5D, this can be performed by performing etching on the transparent film 151 twice (FIG. 7A). Next, as in the case of FIGS. 6A and 6B, metal is arranged in the concave 405, and the light-blocking wall 157 and the light-blocking film 158 are formed (FIG. 7B).

Next, the transparent film 151 is stacked thereon again, the surface of the transparent film 151 is planarized, and the color filter 171 and the on-chip lens 172 are formed thereon in this order (FIG. 7C). Here, an organic film may be arranged between the transparent film 151 and the color filter 171. This is for improvement in adhesion. The process of forming the on-chip lens 172 will be described later in detail. It is possible to manufacture the imaging device 1 through the processes described above. Note that the process of FIG. 7C corresponds to forming an on-chip lens according to an embodiment of the present disclosure.

[Another Method of Manufacturing Imaging Device]

FIGS. 8A, 8B, 8C, and 8D illustrate another example of the method of manufacturing the imaging device according to the first embodiment of the present disclosure. The figure illustrates a process of manufacturing the imaging device 1, and the process is performed after the process of FIG. 5B.

Figure 8A:
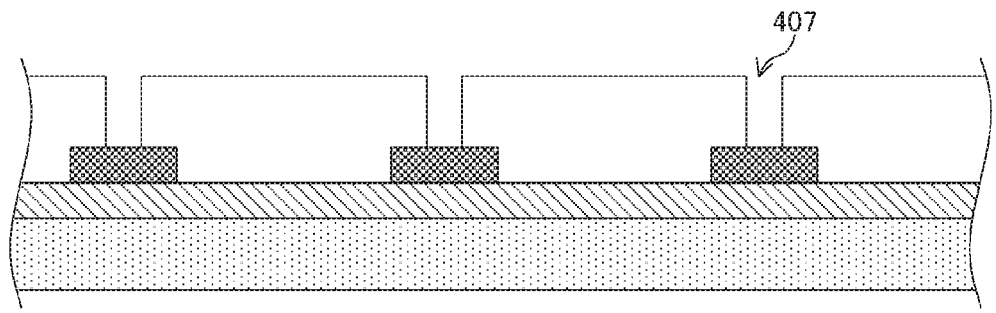
Figure 8B:
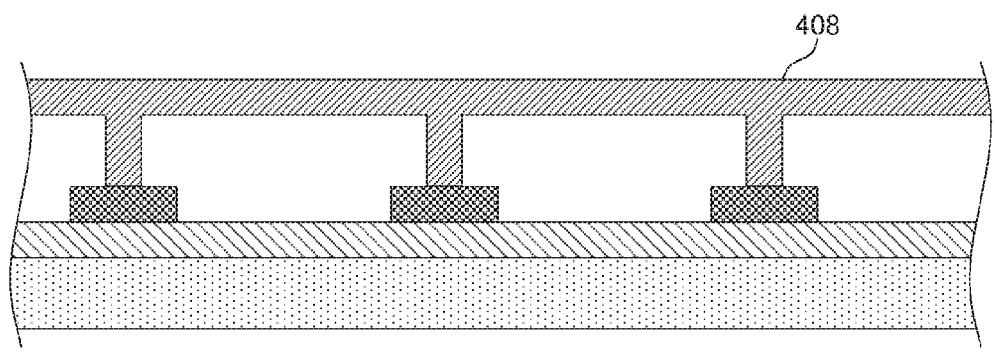
Figure 8C:
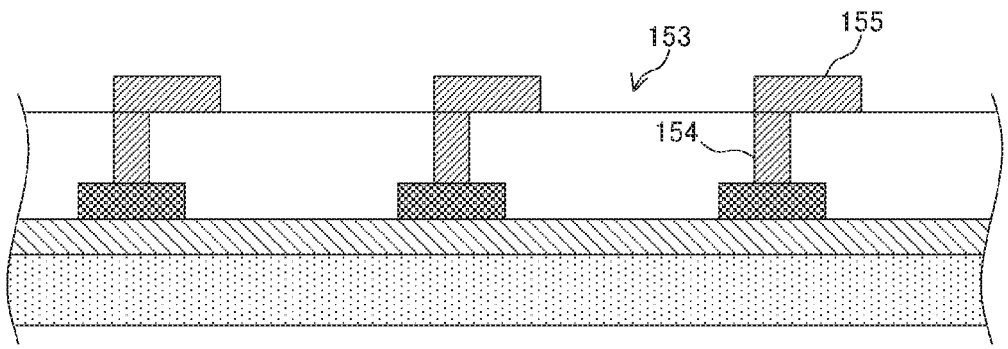
Figure 8D:
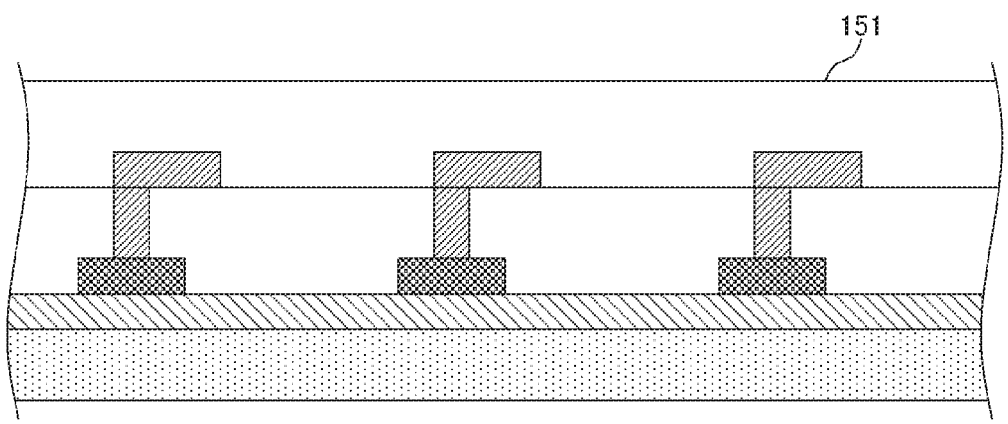

First, a concave 407 is formed in the transparent film 151 by performing etching (FIG. 8A). Next, a metal film 408 is formed. Here, the metal is arranged in the concave 407 (FIG. 8B). Next, etching is performed on the metal film 408 to form the opening 153. This results in forming the light-blocking wall 154 and the light-blocking film 155 at the same time (FIG. 8C). Next, the transparent film 151 is stacked thereon (FIG. 8D). Thereafter, the light-blocking wall 157 and the light-blocking film 158 are similarly formed, and the color filter 171 and the on-chip lens 172 are formed thereon. This makes it possible to manufacture the imaging device 1.

Note that the method of manufacturing the imaging device 1 is not limited to this example. For example, a manufacturing method that includes individually forming the light-blocking wall 154 and the light-blocking film 155 may also be adopted.

[First Modification]

In the imaging device 1 described above, the light-blocking walls 154 and 157 are respectively arranged adjacent to respective ends of the light-blocking film 155. However, the light-blocking walls 154 and 157 may be respectively arranged at positions different from the respective ends of the light-blocking film 155.

FIG. 9 illustrates a configuration example of the pixel according to a first modification of the first embodiment of the present disclosure. The imaging device 1 according to the first modification is different from the imaging device 1 described in FIG. 2 in that the light-blocking walls 154 and 157 in the figure are respectively arranged at positions different from the respective ends of the light-blocking film 155. In the light-blocking film 155 in the figure, regions 161 and 162 in the form of eaves are formed at positions at which the light-blocking walls 154 and 157 are arranged. The regions 161 and 162 are margins at the arrangement positions of the light-blocking walls 154 and 157. As described above, the opening 156 of the light-blocking film 155 and the light-blocking wall 157 are arranged in a state of being shifted according to the amount of pupil correction for each pixel 100. Here, there may be a positional shift in the opening 156 upon forming the opening 156 due to variations in the manufacturing process. Even in such a case, the formation of the regions 161 and 162 makes it possible to prevent the creation of a gap in the light-blocking portion.

[Second Modification]

In the imaging device 1 described above, the light-blocking walls 154 and 157 are arranged adjacent to the light-blocking film 155. However, there may exist a gap between the light-blocking wall 154 and one end of the light-blocking film 155 and a gap between the light-blocking wall 157 and the other end of the light-blocking film 155.

FIG. 10 illustrates a configuration example of the pixel according to a second modification of the first embodiment of the present disclosure. Gaps are formed between the light-blocking walls 154 and 157, and the light-blocking films 155 and 158 in the figure. The gaps can also be used as margins in forming the light-blocking wall 154. Note that there is a need to form gaps sufficiently small with respect to widths of the light-blocking walls 154 and 157 in order to reduce leakage of incident light through the gaps.

[Third Modification]

In the imaging device 1 described above, the light-blocking walls 154 and 157 and the light-blocking films 155 and 158 are used. However, some of them may be omitted.

FIGS. 11A and 11B illustrate a configuration example of the pixel according to a third modification of the first embodiment of the present disclosure. FIG. 11A illustrates an example of the pixel 100 in which the light-blocking film 158 is omitted. Further, FIG. 11B illustrates an example of the pixel 100 in which the light-blocking film 155 and the light-blocking wall 157 are omitted. Incident light is collected in either example, through the opening 156 of the light-blocking film 155 or the like.

As described above, in the imaging device 1 of the first embodiment of the present disclosure, the arrangement of the light-blocking wall 154 and the like and the light-blocking film 155 and the like makes it possible to prevent stray light from entering the photoelectric converter 101 and to reduce the occurrence of crosstalk.

2. Second Embodiment

In the imaging device 1 of the first embodiment described above, incident light is collected by the on-chip lens 172. On the other hand, the imaging device 1 of a second embodiment of the present disclosure is different from the first embodiment described above in that light is further collected by an intralayer lens arranged in the light path portion 150.

[Configuration of Pixel]

FIG. 12 illustrates a configuration example of the pixel according to the second embodiment of the present disclosure. The pixel 100 in the figure is different from the pixel 100 described in FIG. 2 in further including an intralayer lens 164. The intralayer lens 164 is a lens arranged in the light path portion 150, and is a lens that further collects incident light collected by the on-chip lens 172. The intralayer lens 164 can be made of inorganic material such as SiN. The arrangement of the intralayer lens 164 makes it possible to improve the efficiency in collecting incident light in the pixel 100. The intralayer lens 164 in the figure is arranged in the transparent film 151 surrounded by the light-blocking wall 157.

[Method of Manufacturing Imaging Device]

FIGS. 13A, 13B, 13C, 14A, 14B, and 14C illustrate an example of a method of manufacturing the imaging device according to the second embodiment of the present disclosure. The figures illustrate a process of manufacturing the intralayer lens 164 from among the process of manufacturing the imaging device 1, and the process is performed after the process of FIG. 6B. First, a material film 411 of the intralayer lens 164 is formed on the transparent film 151 and the light-blocking film 155. It is possible to form the material film 411 on the transparent film 151 and the light-blocking film 155 using CVD or sputtering (FIG. 13A). Next, a resist 412 is arranged on the material film 411. The resist 412 has a hemispherical shape similar to that of the intralayer lens 164. For example, it is possible to form the resist 412 by the following procedure. First, a photosensitive resist is applied, and then exposure and development are performed to form an island-like resist. Next, heat treatment is performed up to a temperature equal to or higher than a softening point of the resist. This procedure makes it possible to arrange the resist 412 having a hemispherical shape (FIG. 13B).

Next, dry etching is performed using the resist 412 as a mask. This makes it possible to transfer the shape of the resist 412 to the material film 411, and thus to form the intralayer lens 164 (FIG. 13C). Note that it is also possible to form the on-chip lens 172 described with reference to FIG. 2 in a process similar to that of the intralayer lens 164.

Next, the transparent film 151 is formed (FIG. 14A). Next, a concave 413 used to from the light-blocking wall 157 and the light-blocking film 158 is formed in the transparent film 151. From among the concave 413, a concave in which the light-blocking wall 157 is arranged has a shape passing through the intralayer lens 164 (FIG. 14B). Next, the light-blocking wall 157 and the light-blocking film 158 are formed by a process similar to FIG. 7B. Thereafter, the transparent film 151, the color filter 171, and the on-chip lens 172 are formed in this order by a process similar to the process FIG. 7C. The processes described above make it possible to manufacture the imaging device 1 including the intralayer lens 164.

Note that the configuration of the imaging device 1 is not limited to this example. For example, it is also possible to form the intralayer lens 164 at a position in which the intralayer lens 164 is surrounded by the light-blocking wall 154. Further, it is also possible to arrange the intralayer lens with respect to both of the light-blocking walls 154 and 157. Furthermore, from among the pixels 100 arranged in the pixel array 10, it is also possible to arrange the intralayer lens 164 in the pixel 100 including the color filter 171 through which red light is transmitted. Note that, although a structure including both of the light-blocking films 155 and 158 has been described in the present embodiment, the light-blocking film 158 may be omitted, or a single-stage arrangement of a light-blocking film and a light-blocking wall may be adopted, as in the case of the pixel 100 described in FIG. 12.

Except for the points described above, the imaging device 1 has a configuration similar to the configuration of the imaging device 1 described in the first embodiment of the present disclosure. Thus, a description thereof is omitted.

As described above, in the imaging device 1 of the second embodiment of the present disclosure, the arrangement of the intralayer lens 164 makes it possible to improve the efficiency in collecting light.

3. Third Embodiment

In the imaging device 1 of the first embodiment described above, stray light is blocked by the light-blocking films 155 and 158. On the other hand, the imaging device 1 of a third embodiment of the present disclosure is different from the first embodiment described above in that the reflection of light blocked by the light-blocking films 155 and 158 is prevented.

[Configuration of Pixel]

FIG. 15 illustrates a configuration example of a pixel according to the third embodiment of the present disclosure. The pixel 100 in the figure is different from the pixel 100 described in FIG. 2 in further including antireflective films 163 and 164.

The antireflective films 163 and 164 are films that are respectively arranged adjacent to the light-blocking films 155 and 158, and prevent the reflection of light blocked by the light-blocking films 155 and 158. The arrangement of the antireflective films 163 and 164 makes it possible to reduce light reflected off the light-blocking films 155 and 158, and to reduce stray light based on the light reflected off the light-blocking films 155 and 158. For example, it is possible to use, as the antireflective films 163 and 164, a film that has a thickness of a quarter of a wavelength of incident light, and thus reverses a phase of light reflected off the surface of the antireflective film 163, 164 with respect to light reflected off the surface of the light-blocking film 155, 158. Accordingly, the light reflected off the surface of the light-blocking film 155, 158, and the light reflected off the surface of the antireflective film 163, 164 are canceled out, and the reflection is reduced. Such antireflective layers 163 and 164 may be made of, for example, TiN.

Except for the points described above, the imaging device 1 has a configuration similar to the configuration of the imaging device 1 described in the first embodiment of the present disclosure. Thus, a description thereof is omitted.

As described above, in the imaging device 1 of the third embodiment of the present disclosure, it is possible to prevent reflected light form being generated due to the light-blocking films 155 and 158 by arranging the antireflective films 163 and 164 respectively adjacent to the light-blocking films 155 and 158. This makes it possible to reduce the occurrence of crosstalk due to reflected light being reflected off a sealing glass, an infrared absorption filter, or the like again and entering the imaging device 1 again, the sealing glass sealing the imaging device 1, the infrared absorption filter being arranged outside of the imaging device 1. It is possible to reduce flare or ghost generated due to re-reflected light.

4. Fourth Embodiment

In the imaging device 1 of the first embodiment described above, incident light is transmitted through the opening 159 and the like while stray light is blocked by the light-blocking film 158 and the like. On the other hand, the imaging device 1 of a fourth embodiment of the present disclosure is different from the first embodiment in that transmission of stray light through the opening 159 and the like is reduced.

[Configuration of Pixel]

FIG. 16 illustrates a configuration example of a pixel according to the fourth embodiment of the present disclosure. The pixel 100 in the figure is different from the pixel 100 described in FIG. 2 in further including a light-collecting section 165. Note that the imaging device 1 in the figure corresponds to the example in which the light-blocking film 155 and the light-blocking wall 157 are omitted.

The light-collecting section 165 is a film that is arranged near the light-blocking film 158 and has a refractive index (for example, 1.5 or more) higher than that of the transparent film 151. When obliquely incident stray light enters the light-collecting section 165, the stray light is refracted at an interface between the transparent film 151 and the light-collecting section 165. The incident direction is changed, and thus it is possible to guide the stray light to the light-blocking film 158. This makes it possible to improve the efficiency in blocking stray light without reducing the size of the opening 159 of the light-blocking film 158. It is possible to use inorganic material such as SiN for the light-collecting section 165. Further, it is also possible to use material in which particles of a metal compound (such as a Ti compound, a magnesium compound, and an Al compound) are dispersed in a copolymer resin such as an acrylic resin, a styrene resin, and a silane resin.

[Function of Light-Collecting Section]

FIG. 17 illustrates an example of light collection according to the fourth embodiment of the present disclosure. The figure illustrates a state in which stray light is blocked by the light-collecting section 165 and the light-blocking film 158. Incident light 306 in the figure represents stray light obliquely entering the pixel 100. Since the refractive index of the light-collecting section 165 is higher than that of the transparent film 151, the incident light 306 entering the light-collecting section 165 from the transparent film 151 is refracted in the direction illustrated in the figure. Thereafter, the incident light 306 enters the light-blocking film 158 and is blocked. Note that the dotted arrow in the figure represents the incident light 306 when there exists no light-collecting section 165. The arrangement of the light-collecting section 165 makes it possible to block stray light, as in the case of reducing the opening 159. On the other hand, incident light 307 perpendicularly entering the light-collecting section 165 is transmitted through the light-collecting section 165 without being refracted. As described above, it is possible to improve the efficiency in blocking stray light obliquely entering the pixel 100 by changing the incident direction of the stray light such that the stray light enters the light-blocking film 158.

[Another Configuration of Pixel]

FIG. 18 illustrates another configuration example of the pixel according to the fourth embodiment of the present disclosure. The pixel 100 in the figure is different from the pixel 100 described in FIG. 16 in including the light-collecting section 165 arranged at a position different from a position near the opening 159 of the light-blocking film 158.

The light-collecting section 165 in the figure is arranged adjacent to the light-blocking film 158 and includes an opening substantially the same as the opening 159. This makes it possible to reduce a loss of incident light passing near the opening 159, as in the case of the incident light 307 described in FIG. 17. The reason is that there is no reflection of the incident light 307 since the light does not pass through a region of a different refractive index. Note that it is possible to form the light-collecting section 165 in the figure by the following procedure: a material film of the light-blocking film 158 is formed, a material film of the light-collecting section 165 is subsequently formed, and, from among these material films, material films at a position at which the opening 159 is arranged are removed at the same time.

Except for the points described above, the imaging device 1 has a configuration similar to the configuration of the imaging device 1 described in the first embodiment of the present disclosure. Thus, a description thereof is omitted.

As described above, in the imaging device 1 of the fourth embodiment of the present disclosure, the arrangement of the light-collecting section 165 between the transparent film 151 and the light-blocking film 158 makes it possible to improve the efficiency in blocking stray light.

5. Fifth Embodiment

The light-blocking walls 154 and 157 having the same width are used in the imaging device 1 of the first embodiment described above. On the other hand, the imaging device 1 of the fifth embodiment of the present disclosure is different from the first embodiment described above in that a plurality of light-blocking walls each having a different width is used.

[Configuration of Pixel]

FIG. 19 illustrates a configuration example of a pixel according to the fifth embodiment of the present disclosure. The pixel 100 in the figure is different from the pixel 100 described in FIG. 2 in that the light-blocking film 155 is omitted and a light-blocking wall 166 is included instead of the light-blocking wall 154.

The light-blocking wall 166 is a light-blocking wall that has a width larger than that of the light-blocking wall 157. Specifically, the light-blocking wall 166 has a width substantially equal to the size of the light-blocking film 155 in FIG. 2 in a direction parallel to the semiconductor substrate 121. In other words, the light-blocking wall 166 corresponds to the light-blocking film 155 having a thickness that has been made larger such that the light-blocking film 155 is brought into contact with the light-blocking layer 152. This enables the light-blocking wall 166 to perform functions of the light-blocking wall 154 and the light-blocking film 157 in FIG. 2 at the same time. This makes it possible to simplify the process of manufacturing the imaging device 1. It is possible to adjust the width of the light-blocking wall 166 according to the amount of pupil correction. In other words, it is possible to arrange the light-blocking wall 166 having a width proportional to the distance from the optical center of the pixel array 10.

Note that a passage of incident light in the light path portion 150 becomes narrow since the light-blocking wall 166 of a large width is used. There is a possibility that incident light absorbed by the light-blocking wall 166 will be increased and the sensitivity will be reduced. In this case, it is possible to use the light-blocking wall 166 made of material with a relatively high reflectivity of incident light such as Al. It is possible to reduce incident light absorbed by the light-blocking wall 166, and to prevent a decrease in sensitivity.

Except for the points described above, the imaging device 1 has a configuration similar to the configuration of the imaging device 1 described in the first embodiment of the present disclosure. Thus, a description thereof is omitted.

As described above, in the imaging device 1 of the fifth embodiment of the present disclosure, the use of light-blocking walls of different widths makes it possible to simplify the process of manufacturing the imaging device 1.

6. Sixth Embodiment

In the imaging device 1 of the first embodiment described above, incident light is collected by the light path portion 150 that includes the light-blocking walls 154 and 157 and the light-blocking films 155 and 158 in the pixel 100 on which pupil correction has been performed. On the other hand, in a sixth embodiment of the present disclosure, a pixel that detects a phase difference is further arranged in the imaging device 1, and the light path portion 150 described above including this pixel used to detect a phase difference is applied.

[Configuration of Pixel Array]

FIG. 20 illustrates a configuration example of the pixel array according to the sixth embodiment of the present disclosure. The figure is a plan view illustrating a configuration of the light-blocking layers 152 and the on-chip lenses 172 in the pixels 100 arranged in the pixel array 10. The rectangle in the figure represents the opening 153 of the light-blocking layer 152 arranged for each pixel 100, and the dotted line represents the on-chip lens.

A phase difference pixel 110 is arranged in the pixel array 10 in the figure. Here, the phase difference pixel 110 is a pixel used to detect a focal position of an imaging lens. Specifically, it is a pixel used to detect, as a phase difference, misalignment of images that is caused due to light passing through different regions of an imaging lens that collects light from a subject into the pixel array 10. An opening 153a and an opening 153b are arranged in some of the pixels in the figure. With respect to a position, in the light-blocking layer 152, on which an image of an expected principal ray is formed, the opening 153a is opened on the left in the figure and the opening 153b is opened on the right in the figure. A pixel in which the opening 153a is arranged and a pixel in which the opening 153b is arranged respectively correspond to phase difference pixels 110a and 110b. With respect to the opening 153 of the pixel 100, the opening 153a of the phase difference pixel 110a is formed on the left in the figure, and the opening 153b of the phase difference pixel 110b is formed on the right in the figure. Consequently, light passing through a right portion of the imaging lens enters the phase difference pixel 110a, and light passing through a left portion of the imaging lens enters the phase difference pixel 110b. The method of dividing light transmitted through an imaging lens into two, as described above, is referred to as pupil division.

A plurality of such phase difference pixels 110a and a plurality of such phase difference pixels 110b are arranged in the pixel array 10. It is possible to detect a focal position of an imaging lens by detecting a phase difference between an image based on an image signal generated by the plurality of phase difference pixels 110a, and an image based on an image signal generated by the plurality of phase difference pixels 110b. It is possible to perform autofocusing by adjusting a position of the imaging lens on the basis of the detected focal position.

It is possible to arrange the on-chip lens 172 in the phase difference pixels 110a and 110b, as in the case of the pixel 100. However, as described later, an on-chip lens 173 having a different curvature may be arranged instead of the on-chip lens 172 in order to cover the phase difference pixel 110a or the like of which a light collecting position is different. An example of using the on-chip lens 173 having a different curvature will be described in the present embodiment. Note that the configuration of the on-chip lens 173 will be described later in detail.

[Configuration of Pixel]

FIG. 21 illustrates a configuration example of a pixel according to the sixth embodiment of the present disclosure. The figure is a cross-sectional view taken along F-F' line in FIG. 20. The pixel in the figure is different from the pixel 100 described in FIG. 2 in including the phase difference pixels 110a and 110b in which the light-blocking layer 152 including the openings 153a and 153b is arranged. Further, the on-chip lenses 173 of the phase difference pixels 110a and 110b each have a curvature greater than that of the on-chip lens 172 of the pixel 100.

Since the phase difference pixels 110a and 110b are used to detect a focal position, an error due to stray light occurs. However, in the phase difference pixels 110a and 110b in the figure, the arrangement of the light-blocking walls 154 and 157 and the light-blocking films 155 and 158 makes it possible to block stray light, and thus to reduce an error. Further, the use of the light-blocking walls 154 and 157 and the light-blocking films 155 and 158 also makes it possible to reduce crosstalk in the pixel 100 due to the phase difference pixels 110a and 110b.

As described above, the on-chip lens 172 of the pixel 100 collects incident light into the photoelectric converter 101. On the other hand, in the phase difference pixels 110a and 110b, it is necessary that an end of the opening 153 that is included in the light-blocking layer 152 and to which pupil division has been applied be brought into focus, in order to improve the accuracy in pupil division. Thus, the on-chip lenses 173 of the phase difference pixels 110a and 110b are each caused to have a curvature greater than that of the on-chip lens 172. This makes it possible to change the light-collecting position.

It is possible to apply, to such on-chip lenses 172 and 173, processes similar to those of the method of manufacturing the intralayer lens 164 described with reference to FIG. 13. In this case, the resist 412 of FIG. 13B is formed into the resist 412 having shapes of the on-chip lenses 172 and 173. It is possible to form such a resist 412 by the following method. First, a photosensitive resist is thickly applied, and exposure, development, and heat treatment are performed to form the resist 412 corresponding to the position of the on-chip lens 173. Next, a photosensitive resist is applied, and exposure, development, and heat treatment are performed to form the resist 412 corresponding to the position of the on-chip lens 172. As described above, it is possible to form the resist 412 by individually forming the resist 412 having a shape of the on-chip lens 172 and the resist 412 having a shape of the on-chip lens 173. It is possible to form the on-chip lens 172 and the on-chip lens 173 by performing dry etching using the formed resist 412.

Further, it is also possible to form the resist 412 as indicated below. First, the resist 412 having a shape of the on-chip lens 172 is formed at positions of all of on-chip lenses. Next, a photosensitive resist is additionally applied to the resist 412 corresponding to the position of the on-chip lens 173, and exposure, development, and heat treatment are performed again to form the resist 412 having a shape of the on-chip lens 173.

Furthermore, it is also possible to form the resist 412 as indicated below. A photosensitive resist is applied, and then, exposure and development are performed using a grayscale mask corresponding to shapes of the on-chip lens 172 and 173 to control a residual film. This makes it possible to form, by a single exposure, the resist 412 having different thicknesses and covering the on-chip lenses 172 and 173.

[Another Configuration of Pixel Array]

FIGS. 22A and 22B illustrate another configuration example of the pixel array according to the sixth embodiment of the present disclosure. FIG. 22A is a plan view illustrating a configuration of the light-blocking layers 152 and the on-chip lenses 172 in the pixels 100 arranged in the pixel array 10. The phase difference pixels 110a and 110b in the figure are different from the phase difference pixels 110a and 110b described in FIG. 20 in that an on-chip lens 174 is arranged instead of the on-chip lens 173. As illustrated in FIG. 22A, the on-chip lenses 174 arranged in the phase difference pixels 110a and 110b each have a hemispherical shape. FIG. 22B is a cross-sectional view illustrating a configuration example of the on-chip lenses 172 and 174 taken along G-G' line of FIG. 22A. It is possible to collect incident light at a single point since the on-chip lens 174 has a hemispherical shape, as described above. This makes it possible to prevent astigmatism from being exhibited, and to improve the accuracy in detecting a phase difference.

It is possible to form the on-chip lenses 172 and 174 by, for example, changing the shape of a photomask that is used when a photosensitive resist is exposed in conformity to the on-chip lenses 172 and 174.

[Another Configurations of Pixel]

Figure 23:
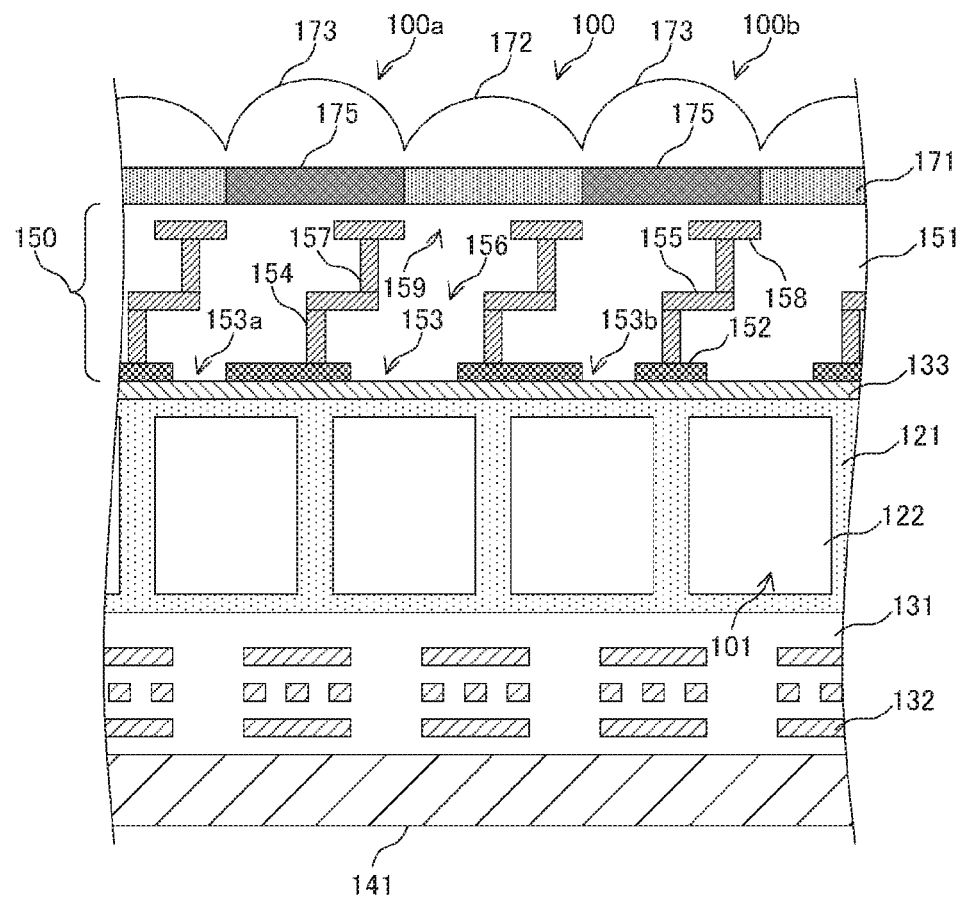

FIG. 23 illustrates another configuration example of the pixel according to the sixth embodiment of the present disclosure. The phase difference pixels 110a and 110b in the figure are different from the phase difference pixels 110a and 110b described in FIG. 21 in that a color filter 175 is arranged instead of the color filter 171. The color filter 175 is a color filter with an improved transmittance of incident light. For example, it is possible to use, as the color filter 175, a color filter that deals with cyan, yellow, gray, and white with which all of the pieces of visible light are transmitted through the color filter.

Since the sensitivity of the phase difference pixels 110a and 110b to which pupil division is applied, is lower than that of the pixel 100, it is difficult to detect a focal position in an environment of a low luminous intensity, such as at night. The arrangement of the color filter 175 described above results in an increase in an amount of incident light, and this makes it possible to increase the sensitivity of the phase difference pixels 110a and 110b. However, due to color filters of different transmittances being arranged in the phase difference pixel 110a or the like, an image signal of the pixel 100 surrounding the phase difference pixel 110a or the like exhibits a high brightness, and this may result in a reduction in image quality due to occurrence of so-called floating. The reason is that the color filter 175 of a high transmittance increases crosstalk in the adjacent pixel 100. It is also possible to prevent a reduction in image quality in such a case, since crosstalk is reduced by light-blocking being performed using the light-blocking walls 154 and 157 and the light-blocking films 155 and 158.

Except for the points described above, the imaging device 1 has a configuration similar to the configuration of the imaging device 1 described in the first embodiment of the present disclosure. Thus, a description thereof is omitted.

As described above, in the imaging device 1 of the sixth embodiment of the present disclosure, the arrangement of the light-blocking walls 154 and 157 and the light-blocking film 155 makes it possible to suppress a phenomenon in which it looks like an image around the phase difference pixels 110a and 110b is floating due to stray light. Further, it is possible to reduce an impact stray light has on the phase difference pixels 110a and 110b, and thus to improve the accuracy in detecting a phase difference.

7. Example of Application to Camera

The technology according to the present disclosure (the present technology) is applicable to various products. For example, the present technology may be implemented as an imaging device included in an image-capturing apparatus such as a camera.

Figure 24:
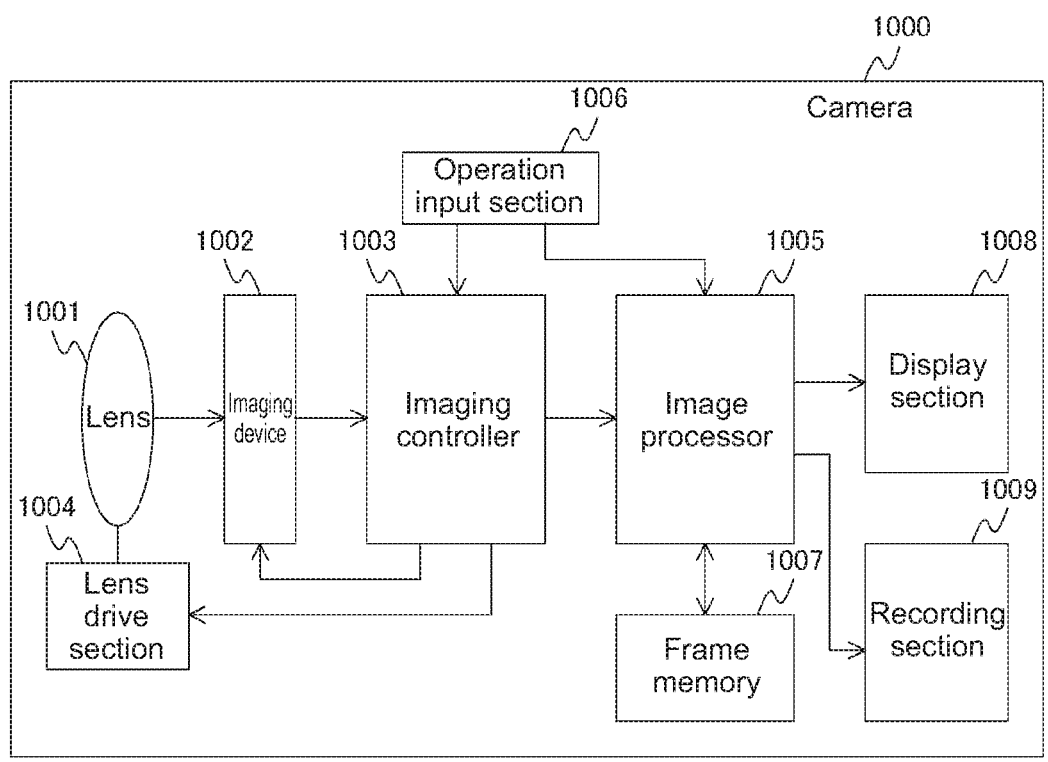

FIG. 24 is a block diagram illustrating an example of a schematic configuration of a camera that is an example of an image-capturing apparatus to which the present technology may be applied. The camera 1000 in the figure includes a lens 1001, an imaging device 1002, an imaging controller 1003, a lens drive section 1004, an image processor 1005, an operation input section 1006, a frame memory 1007, a display section 1008, and a recording section 1009.

The lens 1001 is an imaging lens of the camera 1000. The lens 1001 collects light from a subject, and causes the collected light to enter the imaging device 1002 described later to form an image of the subject.

The imaging device 1002 is a semiconductor device that images the light from the subject that is collected by the lens 1001. The imaging device 1002 generates an analog image signal depending on irradiated light, and converts the analog image signal into a digital image signal to output the digital image signal.

The imaging controller 1003 controls imaging performed by the imaging device 1002. The imaging controller 1003 performs control of the imaging device 1002 by generating a control signal and outputting the control signal to the imaging device 1002. Further, the imaging controller 1003 is capable of performing autofocusing in the camera 1000 on the basis of the image signal output from the imaging device 1002. Here, the autofocusing is a system that detects a focal position of the lens 1001 and automatically adjusts the focal position. It is possible to use, as the autofocusing, a method of detecting a focal position by detecting an image-plane phase difference using a phase difference pixel arranged in the imaging device 1002 (image-plane-phase-difference autofocusing). Further, it is also possible to apply a method (contrast autofocusing) that includes detecting, as the focal position, a position in which an image exhibits a highest contrast. The imaging controller 1003 adjusts the position of the lens 1001 through the lens drive section 1004 on the basis of the detected focal position, and performs autofocusing. Note that the imaging controller 1003 can be implemented by, for example, a digital signal processor (DSP) that includes firmware.

The lens drive section 1004 drives the lens 1001 on the basis of control performed by the imaging controller 1003. The lens drive section 1004 is capable of driving the lens 1001 by changing the position of the lens 1001 using a built-in motor.

The image processor 1005 processes the image signal generated by the imaging device 1002. Examples of the processing include demosaicking that generates an image signal of a missing color from among image signals for respective pixels that respectively correspond to red, green, and blue; noise reduction that removes noise from an image signal; and encoding of an image signal. The image processor 1005 can be implemented by, for example, a microcomputer that includes firmware.

The operation input section 1006 receives an operation input from a user of the camera 1000. For example, it is possible to use a push button or a touch panel as the operation input section 1006. An operation input received by the operation input section 1006 is transmitted to the imaging controller 1003 and the image processor 1005. Thereafter, a process corresponding to the operation input such as a process of capturing an image of a subject, is started.

The frame memory 1007 is a memory that stores therein a frame that is an image signal for a single screen. The frame memory 1007 is controlled by the image processor 1005, and holds a frame in the process of image processing.

The display section 1008 displays thereon an image processed by the image processor 1005. For example, it is possible to use a liquid crystal panel as the display section 1008.

The recording section 1009 records therein an image processed by the image processor 1005. For example, it is possible to use a memory card or a hard disk as the recording section 1009.

The camera to which the present disclosure may be applied has been described above. The present technology may be applied to the imaging device 1002 from among the components described above. Specifically, the imaging device 1 described in FIG. 1 is applicable to the imaging device 1002. The application of the imaging device 1 to the imaging device 1002 results in a reduction in the occurrence of crosstalk, and this makes it possible to prevent a reduction in image quality of an image generated by the camera 1000.

Note that, although a camera has been described as an example, the technology according to the present disclosure may be additionally applied to, for example, a monitoring apparatus.

Finally, the descriptions of the respective embodiments above are examples of the present disclosure, and the present disclosure is not limited to the embodiments described above. Thus, various modifications may of course be made depending on the design and the like without departing from the technical idea according to the present disclosure even in the case of an embodiment other than the embodiments described above.

Note that the present technology may take the following configurations.

(1) An imaging device, including:
 a plurality of photoelectric converters each formed on a semiconductor substrate and each performing photoelectric conversion according to incident light;
 a light path portion that includes
  a transparent film through which the incident light is transmitted,
  a light-blocking wall for each of the plurality of photoelectric converters, the light-blocking wall partitioning the transparent film in a direction perpendicular to the semiconductor substrate, and blocking light, and
  a light-blocking film that is arranged near an end of the light-blocking wall, the end being situated opposite to an end of the light-blocking wall that is situated closer to the semiconductor substrate, the light-blocking film having a film shape parallel to the semiconductor substrate, and including, for each of the plurality of photoelectric converters, an opening through which the incident light is transmitted; and an on-chip lens that is arranged for each of the plurality of photoelectric converters, and collects the incident light into the photoelectric converter through the light path portion.

(2) The imaging device according to (1), in which
 the light path portion includes a plurality of the light-blocking walls.

(3) The imaging device according to (2), in which
 the light-blocking film is arranged near at least one of the plurality of the light-blocking walls.

(4) The imaging device according to (3), in which
 when the light-blocking film is arranged between two of the plurality of the light-blocking walls, at least one of the two of the plurality of the light-blocking walls is arranged at a position different from an end of the light-blocking film.

(5) The imaging device according to any one of (2) to (4), in which
 the light-blocking walls of the plurality of the light-blocking walls are each formed to have a different width.

(6) The imaging device according to any one of (1) to (5), in which
 the light-blocking film is arranged adjacent to the light-blocking wall.

(7) The imaging device according to any one of (1) to (6), in which
 the light-blocking film is made of the same material as the light-blocking wall.

(8) The imaging device according to (7), in which
 the light-blocking film is formed at the same time as the light-blocking wall.

(9) The imaging device according to any one of (1) to (8), in which
 in the light path portion, the light-blocking wall and the opening of the light-blocking film are arranged in a state of being shifted according to an incident angle of the incident light.

(10) The imaging device according to any one of (1) to (9), further including
 a light-collecting section that is arranged near the light-blocking film, and has a refractive index different from a refractive index of the transparent film.

(11) The imaging device according to (10), in which
 the light-collecting section is arranged at a position different from a position near the opening of the light-blocking film.

(12) The imaging device according to any one of (1) to (11), further including
 an antireflective film that is arranged adjacent to the light-blocking film and prevents reflection of the incident light.

(13) The imaging device according to any one of (1) to (12), in which
 the light-blocking film includes the opening having a shape other than a rectangle.

(14) The imaging device according to any one of (1) to (13), further including
 an intralayer lens that is arranged in the light path portion and collects the incident light.

(15) The imaging device according to any one of (1) to (14), further including
 a plurality of pixels each including the photoelectric converter, the on-chip lens, and the light path portion, each of the plurality of pixels further including a light-blocking layer that is arranged between the semiconductor substrate and the light path portion for each of the plurality of pixels, and includes an opening through which the incident light is transmitted.

(16) The imaging device according to (15), further including
 a phase difference pixel that is the pixel performing pupil division with respect to the incident light from a subject by arranging the opening of the light-blocking layer in a state of being shifted in a specified pupil-division direction, and detecting a phase difference.

(17) A method of manufacturing an imaging device, the method including:
 forming a transparent film on a semiconductor substrate on which a photoelectric converter performing photoelectric conversion according to incident light is formed, the transparent film being a transparent film through which the incident light is transmitted;
 forming, for each photoelectric conversion, a light-blocking wall that partitions the formed transparent film in a direction perpendicular to the semiconductor substrate, and blocks light;
 forming a light-blocking film that is arranged near an end of the formed light-blocking wall, the end being situated opposite to an end of the light-blocking wall that is situated closer to the semiconductor substrate, the light-blocking film having a film shape parallel to the semiconductor substrate, and including, for each photoelectric converter, an opening through which the incident light is transmitted; and forming an on-chip lens that collects the incident light into the photoelectric converter.

REFERENCE SIGNS LIST 1 imaging device
10 pixel array
100 pixel
101 photoelectric converter
110, 110a, 110b phase difference pixel
121 semiconductor substrate
133 insulation film
150 light path portion
151 transparent film
152 light-blocking layer
153, 153a, 153b, 156, 159 opening
154, 157, 166 light-blocking wall
155, 158 light-blocking film
163 antireflective film
164 intralayer lens
165 light-collecting section
171, 175 color filter
172, 173, 174 on-chip lens
1002 imaging device

The invention claimed is:

1. An imaging device, comprising:
a plurality of photoelectric converters on a semiconductor substrate, wherein each of the plurality of photoelectric converters is configured to perform photoelectric conversion according to incident light;
a light path portion that includes:
  a transparent film through which the incident light is transmissible;
  a first light-blocking wall for each of the plurality of photoelectric converters, wherein
    the first light-blocking wall partitions the transparent film in a direction perpendicular to the semiconductor substrate, and
    the first light-blocking wall is configured to block the incident light;
  a light-blocking film at a first end of the first light-blocking wall, wherein
    the first end is opposite to a second end of the first light-blocking wall that is closer to the semiconductor substrate,
    the light-blocking film has a length parallel to the semiconductor substrate, and
    the light-blocking film includes, for each of the plurality of photoelectric converters, an opening through which the incident light is transmissible; and
  a second light-blocking wall configured to block the incident light, wherein
    the light-blocking film is between the first light-blocking wall and the second light-blocking wall, and
    the first light-blocking wall and the second light-blocking wall are at opposite ends of the light-blocking film in a direction parallel to the semiconductor substrate; and
an on-chip lens that corresponds to each of the plurality of photoelectric converters, wherein the on-chip lens is configured to collect the incident light into a photoelectric converter of the plurality of photoelectric converters through the light path portion.

2. The imaging device according to claim 1, wherein the light path portion includes a plurality of light-blocking walls including the first light-blocking wall and the second light-blocking wall.

3. The imaging device according to claim 2, wherein the light-blocking film is adjacent to at least one of the plurality of light-blocking walls.

4. The imaging device according to claim 3, wherein at least one of the plurality of light-blocking walls is at a position different from an end of the light-blocking film.

5. The imaging device according to claim 2, wherein the plurality of light-blocking walls each have a different width.

6. The imaging device according to claim 1, wherein the light-blocking film is adjacent to the first light-blocking wall.

7. The imaging device according to claim 1, wherein the light-blocking film is made of a same material as the first light-blocking wall.

8. The imaging device according to claim 7, wherein the light-blocking film is formed at a same time as the first light-blocking wall.

9. The imaging device according to claim 1, wherein in the light path portion, the first light-blocking wall and the opening of the light-blocking film are shifted with respect to a center of the photoelectric converter.

10. The imaging device according to claim 1, further comprising a light-collecting section adjacent to the light-blocking film, wherein the light-collecting section has a refractive index different from a refractive index of the transparent film.

11. The imaging device according to claim 10, wherein the light-collecting section is at a position different from a position of the opening of the light-blocking film.

12. The imaging device according to claim 1, further comprising an antireflective film adjacent to the light-blocking film, wherein the antireflective film is configured to prevent reflection of the incident light.

13. The imaging device according to claim 1, wherein the light-blocking film includes the opening having a shape other than a rectangle.

14. The imaging device according to claim 1, further comprising an intralayer lens in the light path portion, wherein the intralayer lens is configured to collect the incident light.

15. The imaging device according to claim 1, further comprising a plurality of pixels each including the photoelectric converter, the on-chip lens, and the light path portion, wherein
  each of the plurality of pixels further includes a light-blocking layer between the semiconductor substrate and the light path portion for each of the plurality of pixels, and
  the light-blocking layer includes an opening through which the incident light is transmissible.

16. The imaging device according to claim 15, further comprising a phase difference pixel configured to perform pupil division with respect to the incident light, wherein
  the pupil division is performed by arrangement of the opening of the light-blocking layer in a state of being shifted in a specified pupil-division direction, and
  the phase difference pixel is configured to detect a phase difference.

17. The imaging device according to claim 1, wherein an amount of shift of the second light-blocking wall with respect to a center of the photoelectric converter is more than an amount of shift of the first light-blocking wall with respect to the center of the photoelectric converter.

18. A method of manufacturing an imaging device, the method comprising:
  forming a transparent film on a semiconductor substrate on which a photoelectric converter configured to perform photoelectric conversion according to incident light is formed, wherein the transparent film is transmissive to the incident light;

forming, for each photoelectric conversion, a first light-blocking wall configured to partition the transparent film in a direction perpendicular to the semiconductor substrate, wherein the first light-blocking wall is configured to block the incident light;

forming a light-blocking film at a first end of the first light-blocking wall, wherein
- the first end is opposite to a second end of the first light-blocking wall that is closer to the semiconductor substrate,
- the light-blocking film has a length parallel to the semiconductor substrate, and
- the light-blocking film includes, for each photoelectric converter, an opening through which the incident light is transmissible;

forming a second light-blocking wall configured to block the incident light, wherein
- the light-blocking film is between the first light-blocking wall and the second light-blocking wall, and
- the first light-blocking wall and the second light-blocking wall are at opposite ends of the light-blocking film in a direction parallel to the semiconductor substrate; and forming an on-chip lens configured to collect the incident light into the photoelectric converter.

* * * * *